(12) United States Patent
Nakatsuka

(10) Patent No.: US 9,773,539 B2
(45) Date of Patent: Sep. 26, 2017

(54) LOGICAL OPERATION CIRCUIT AND MEMORY DEVICE

(71) Applicant: Keisuke Nakatsuka, Seoul (KR)

(72) Inventor: Keisuke Nakatsuka, Seoul (KR)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 14/974,282

(22) Filed: Dec. 18, 2015

(65) Prior Publication Data

US 2017/0076774 A1 Mar. 16, 2017

Related U.S. Application Data

(60) Provisional application No. 62/216,734, filed on Sep. 10, 2015.

(51) Int. Cl.

| | | |
|---|---|---|
| *G11C 11/16* | (2006.01) | |
| *G11C 5/06* | (2006.01) | |
| *H01L 27/22* | (2006.01) | |
| *H01L 43/08* | (2006.01) | |
| *H03K 19/18* | (2006.01) | |

(52) U.S. Cl.
CPC .......... *G11C 11/1675* (2013.01); *G11C 5/063* (2013.01); *H01L 27/222* (2013.01); *H01L 43/08* (2013.01); *H03K 19/18* (2013.01)

(58) Field of Classification Search
None
See application file for complete search history.

(56) References Cited

U.S. PATENT DOCUMENTS

| | | | |
|---|---|---|---|
| 2008/0238475 A1 | 10/2008 | Chua-Eoan et al. | |
| 2008/0310214 A1* | 12/2008 | Wang | G11C 11/16 365/158 |
| 2010/0244897 A1 | 9/2010 | Saito et al. | |
| 2011/0063899 A1* | 3/2011 | Ogimoto | G11C 11/16 365/158 |
| 2011/0148458 A1 | 6/2011 | Sugibayashi et al. | |

\* cited by examiner

*Primary Examiner* — James G Norman
(74) *Attorney, Agent, or Firm* — Holtz, Holtz & Volek PC

(57) ABSTRACT

According to one embodiment, a logical operation circuit includes a magnetic tunnel junction (MTJ) element and driver. The MTJ element includes a first magnetic layer, a second magnetic layer, and an intermediate layer between the first and second magnetic layers. An orientation of magnetization of the second magnetic layer flips by a first current which flows through the MTJ element in a first state from the second magnetic layer to the first magnetic layer. The driver is coupled to the first magnetic layer without a magnetic layer interposed and coupled to the second magnetic layer, and passes a second current through the MTJ element in the first state from the second magnetic layer to the first magnetic layer. A magnitude of the second current is larger than 1.5 times a magnitude of the first current.

15 Claims, 14 Drawing Sheets

Or

| | | Data in MTJ | |
|---|---|---|---|
| | | 0 | 1 |
| Vsw1 (V1 (high) or not, or IS1 (high) or not) | 0 | 0 (P→P) | 1 (AP→AP) |
| | 1 | 1 (P→AP) | 0 (AP→P) |

=XOR

|  |  | Data in MTJ | |
|---|---|---|---|
|  |  | 0 | 1 |
| Vsw2 (V2 (low) or not, or IS2 (low) or not) | 0 | 0 (P→P) | 1 (AP→AP) |
|  | 1 | 0 (P→P) | 0 (AP→P) |

FIG. 9

|  |  | Data in MTJ | |  |
|---|---|---|---|---|
|  |  | 0 | 1 |  |
| /Vsw2 (V2 (low) or not, or IS2 (low) or not) | 0 | 0 (P→P) | 0 (AP→P) | =AND |
|  | 1 | 0 (P→P) | 1 (AP→AP) |  |

FIG. 10

|  |  | Data in MTJ | |
|---|---|---|---|
|  |  | 0 | 1 |
| /Vsw1 (V1 (high) or not, or IS1 (high) or not) | 0 | 1 (P→AP) | 0 (AP→P) |
|  | 1 | 0 (P→P) | 1 (AP→AP) |

FIG. 11

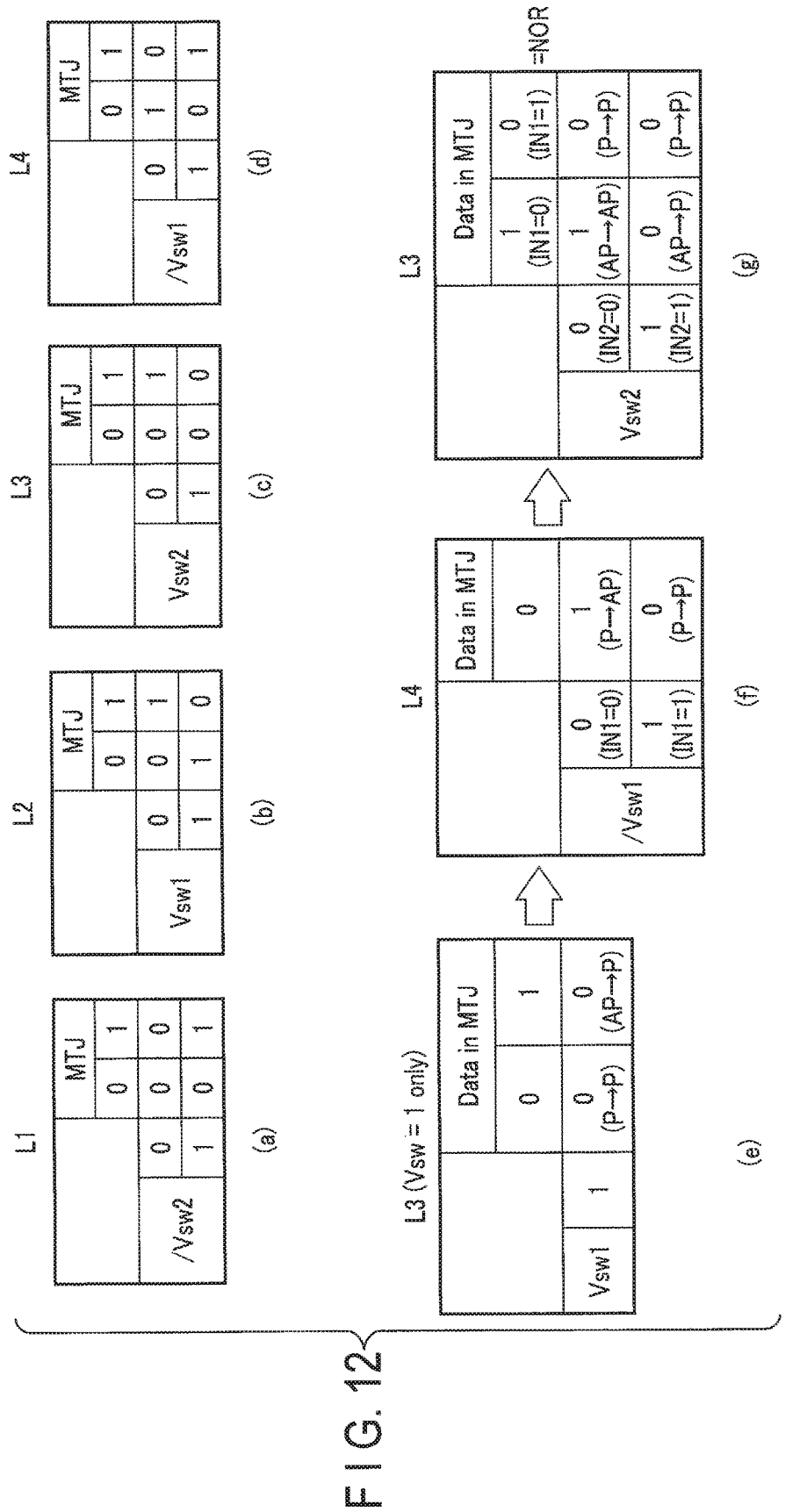
F I G. 12

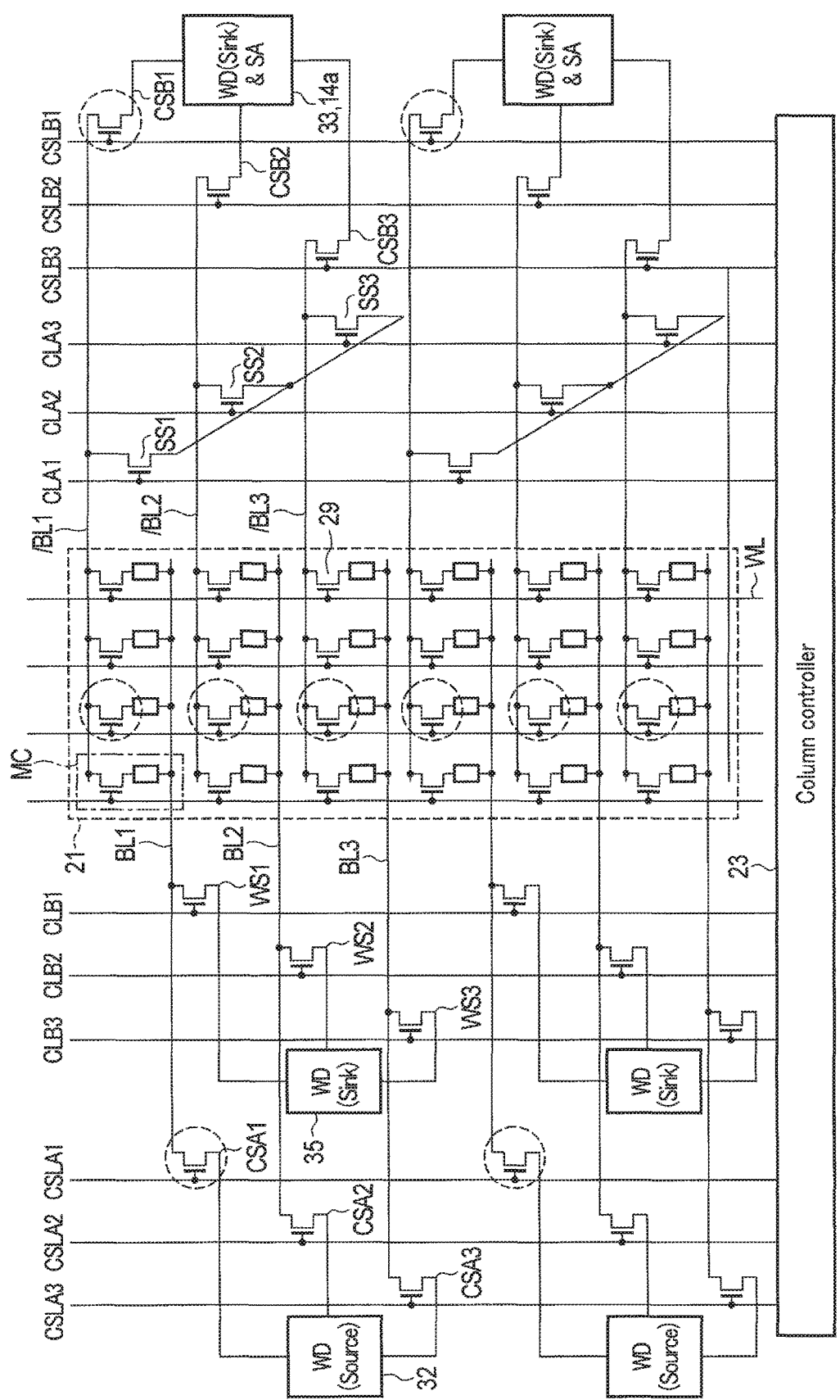
F I G. 19

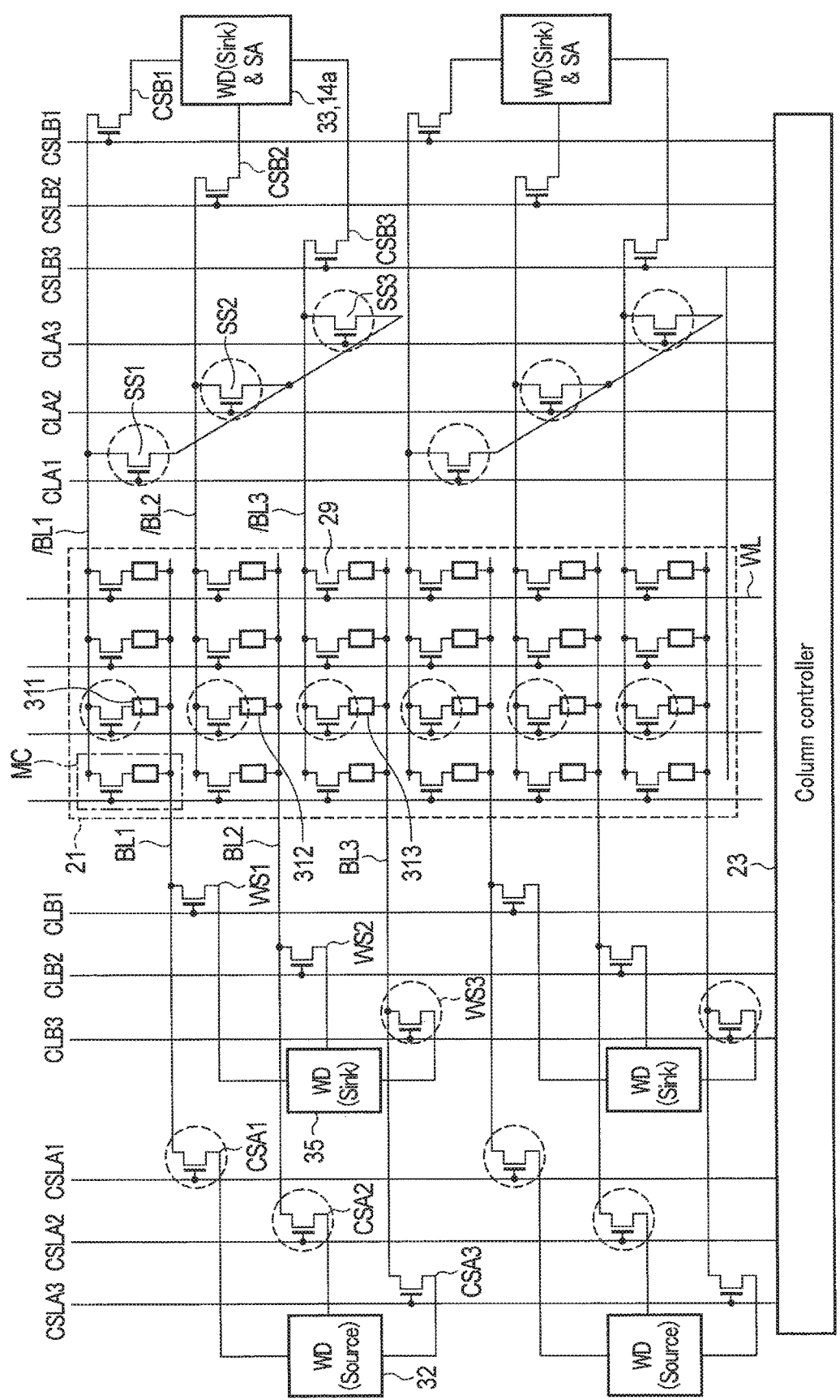
F I G. 20

LOGICAL OPERATION CIRCUIT AND MEMORY DEVICE

CROSS-REFERENCE TO RELATED APPLICATIONS

This application claims the benefit of U.S. Provisional Application No. 62/216,734, filed Sep. 10, 2015, the entire contents of which are incorporated herein by reference.

FIELD

Embodiments relate to a logical operation circuit and a memory device.

BACKGROUND

Logical operation circuits implemented by combining transistors are known.

BRIEF DESCRIPTION OF THE DRAWINGS

FIG. 9 illustrates a second example of correspondence between an input and an output of the logical operation circuit of the first embodiment;

FIG. 10 illustrates a third example of correspondence between an input and an output of the logical operation circuit of the first embodiment;

FIG. 11 illustrates a fourth example of correspondence between an input and an output of the logical operation circuit of the first embodiment;

FIG. 12 illustrates an example of steps and states in the course of an operation by the logical operation circuit of the first embodiment;

FIG. 19 illustrates connections of components during a read and a write by the memory device of the second embodiment;

FIG. 20 illustrates connections of components during a logical operation in the memory device of the second embodiment;

DETAILED DESCRIPTION

Figure 1:
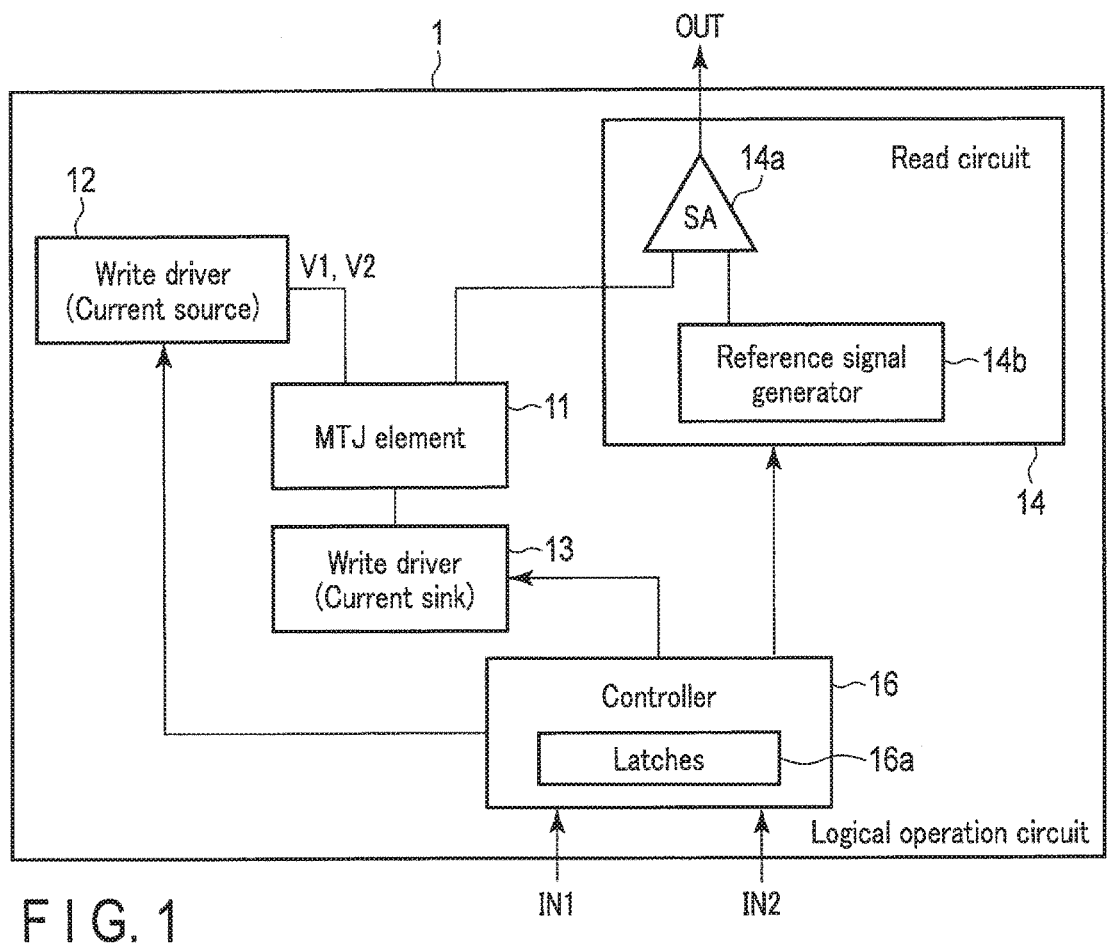
FIG. 1 illustrates functional blocks of a logical operation cult of a first embodiment.

According to one embodiment, a logical operation circuit includes a magnetic tunnel junction (MTJ) element and driver. The MTJ element includes a first magnetic layer, a second magnetic layer, and an intermediate layer between the first and second magnetic layers. An orientation of magnetization of the second magnetic layer flips by a first current which flows through the MTJ element in a first state from the second magnetic layer to the first magnetic layer. The driver is coupled to the first magnetic layer without a magnetic layer interposed and coupled to the second magnetic layer, and passes a second current through the MTJ element in the first state from the second magnetic layer to the first magnetic layer. A magnitude of the second current is larger than 1.5 times a magnitude of the first current.

Embodiments will now be described with reference to the figures. In the following description, components with substantially the same functionalities and configurations will be referred to with the same reference numerals, and repeated descriptions may be omitted. The figures are schematic. The description for a particular embodiment is also applicable as a description of another embodiment, unless it is indicatively or obviously inapplicable. Each embodiment illustrates devices and methods for materializing the technical idea of this embodiment. It is not necessary that functional blocks are distinguished as in the following examples. For example, some of the functions may be implemented by functional blocks different from those illustrated below. Furthermore, an illustrated functional block may be divided into functional sub-blocks.

First Embodiment (Structure, or Configuration)

FIG. 1 illustrates functional blocks of a logical operation circuit 1 of the first embodiment. For example, the logical operation circuit 1 can be provided as a semiconductor chip. Specifically, it can be implemented with the combination of various layers on a semiconductor substrate and areas where impurities are diffused.

The logical operation circuit 1 includes a magnetic tunnel junction (MTJ) element 11, a write driver (current source) 12, a write driver (current sink) 13, a read circuit 14, and a controller 16.

The MTJ element 11, the write drivers 12 and 13, and the read circuit 14 can be the same as or similar to an MTJ element, a write driver (current source), a write driver (current sink), and a read circuit of a magnetoresistive random access memory (MRAM), respectively. The details including the same or different points in corresponding pairs will be described in the following.

The MTJ element 11 can be based on an MTJ element in a memory element (cell) of the MRAM, and includes the MTJ. The MTJ element 11 can take one of two steady states as well as the MTJ element of the MRAM cell. One of the two steady states is the state of a higher resistance, and the other is the state of a lower resistance. The MTJ element 11 will be described in detail later.

The read circuit 14 includes a sense amplifier circuit 14a and a reference current generator 14b. The sense amplifier circuit 14a and the reference current generator 14b can have the same components, connections and functionalities as a sense amplifier circuit and a reference current generator used in the MRAM, respectively. The read circuit 14 can pass a read current through the MTJ element 11. The sense amplifier circuit 14a operates to allow the read current to flow through the MTJ element 11, and it compares the read current with a reference current.

The reference current has the magnitude between the magnitude of the current which flows through the MTJ element 11 in the lower resistance state and the magnitude of the current which flows through the MTJ element 11 in the higher resistance state. The reference current is generated by the reference current generator 14b. The reference current can be generated by any known method, and for example, a current which flows through a resistance element with a fixed resistance or a current which flows through the parallel, connection of the MTJ element 11 in the lower resistance state and the MTJ element 11 in the higher resistance state can be used.

The sense amplifier circuit 14a outputs a digital low level ("0" data), when, for example, the read current is larger than the reference current. The output of "0" data from the sense amplifier circuit 14a indicates that the MTJ element 11 has the lower resistance. In contrast, the sense amplifier circuit 14a outputs a digital high level ("1" data) when, for example, the read current is smaller than the reference current. The output of "1" data from the sense amplifier circuit 14a indicates that the MTJ element 11 has the higher resistance. The output OUT of the sense amplifier circuit 14a is the output of the logical operation circuit 1.

The write drivers 12 and 13 supply a write current (or, electron flow) to the MTJ element 11 in conjunction. The write driver 12 receives a power voltage from the outside, or when the logical operation circuit 1 is provided in a semiconductor chip, from the outside of the semiconductor chip, and it can generate at least two voltages V1 and V2 of different magnitudes and output one of them. The voltage V2 is smaller than the voltage V1, and the voltages V1 and V2 have positive values larger than zero. The write driver 12 applies the voltage V1 or V2 to the MTJ element 11 in conjunction with the write driver 13. This application of the voltage makes a current flow through the MTJ element 11. With this current, the state (resistance) of the MTJ element 11 is maintained or shifts to the other state.

The write driver 13 is, for example, an n-type metal oxide semiconductor field effect transistor (MOSFET) between the MTJ element 11 and the node of the ground potential. The write driver 12 includes a voltage generator which generates the voltages V1 and V2, and a p-type MOSFET between the output node of the voltage generator and the MTJ element 11.

The controller 16 receives two input signals IN1 and IN2. The input signals IN1 and IN2 are digital signals. The controller 16 controls the write drivers 12 and 13 and the sense amplifier circuit 14a based on the logic of each of the input signals IN1 and IN2. The controller 16 includes latch, circuits 16a. The controller 16 uses the latch circuits 16a to store various data.

Figure 2:
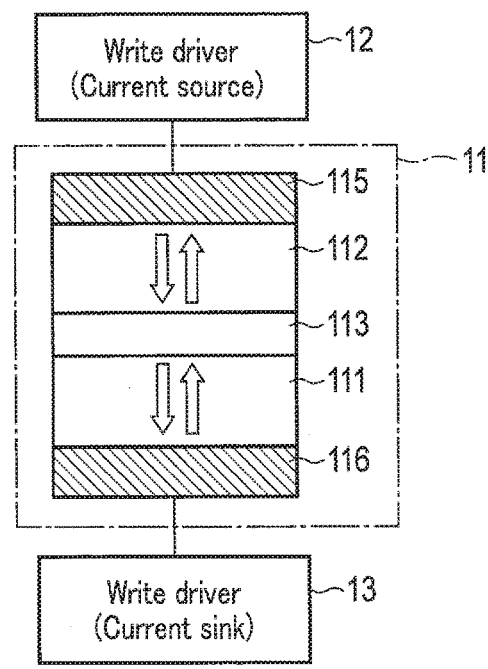
FIG. 2 illustrates the structure of an MTJ element of the logical operation circuit of the first embodiment.

Referring to FIG. 2, the MTJ element 11 will now be described in detail. As illustrated in FIG. 2, the MTJ element 11 includes magnetic layers 111 and 112, and an intermediate layer 113 between the two magnetic layers 111 and 112. The intermediate layer 113 serves as a tunnel barrier. The MTJ element 11 may include additional layers, and each of the layers 111 to 113 may include plural sub-layers. No magnetic layer is provided between the magnetic layer 112 and the output of the write drives 12, and the magnetic layer 112 is electrically coupled to the output of the write driver 12 with no magnetic layer therebetween. For example, the magnetic layer 112 is coupled to an electrode 115 at the side opposite to the intermediate layer 113, and the electrode 115 is coupled to an interconnect which is coupled to the output of the write driver 12.

The magnetic layer 111 may also be electrically coupled to the output of the write driver 13 with no magnetic layer therebetween. For example, the magnetic layer 111 is coupled to an electrode 116 at the side opposite to the intermediate layer 113, and the electrode 116 may be coupled to an interconnect which is coupled to the output of the write driver 13.

The magnetic layers 111 and 112 have functionalities and properties similar to a storage layer and a reference layer of the MTJ element of the MRAM cell, respectively. The magnetic layers 111 and 112 are magnetized along a particular axis (illustrated by the arrows), and magnetizations of the magnetic layers 111 and 112 are stable along the direction, along an axis which pierces through the magnetic layers 111, 112, and 113, for example. The magnetic layers 111 and 112 have the magnetic anisotropies along the axis which pierces through the magnetic layers 111, 112, and 113, and in other words have a so-called perpendicular magnetic anisotropy. The magnetization of each of the magnetic layers 111 and 112 can stabilize in one of the two directions along the magnetization easy axis.

The MTJ element 11 exhibits a resistance of a low value when the orientation of the magnetization of the magnetic layer 111 is parallel to the orientation of the magnetization of the magnetic layer 112. The MTJ element 11 exhibits a resistance of a high value when the orientation of the magnetization of the magnetic layer 111 is antiparallel to the orientation of the magnetization of the magnetic layer 112. Whether the MTJ element is in the state of the higher or lower resistance, i.e., the resistance state of the MTJ element 11, can be determined with the same method as the read from the MRAM cell. Hereinafter, the state in which the orientations of the two magnetic layers of the MTJ element (including the MTJ element 11) are antiparallel (the higher resistance state) is referred to as an AP state, and the state in which they are parallel (the lower resistance state) is referred to as a P state.

The MTJ element 11 can be transferred between the two resistance states by the flow of spin-polarized electrons through the magnetic layers 111 and 112 (or, a so-called spin injection) as the MTJ element of the MRAM cell. Switching currents to switch the two resistance states include various types as described in the following.

Figure 3:
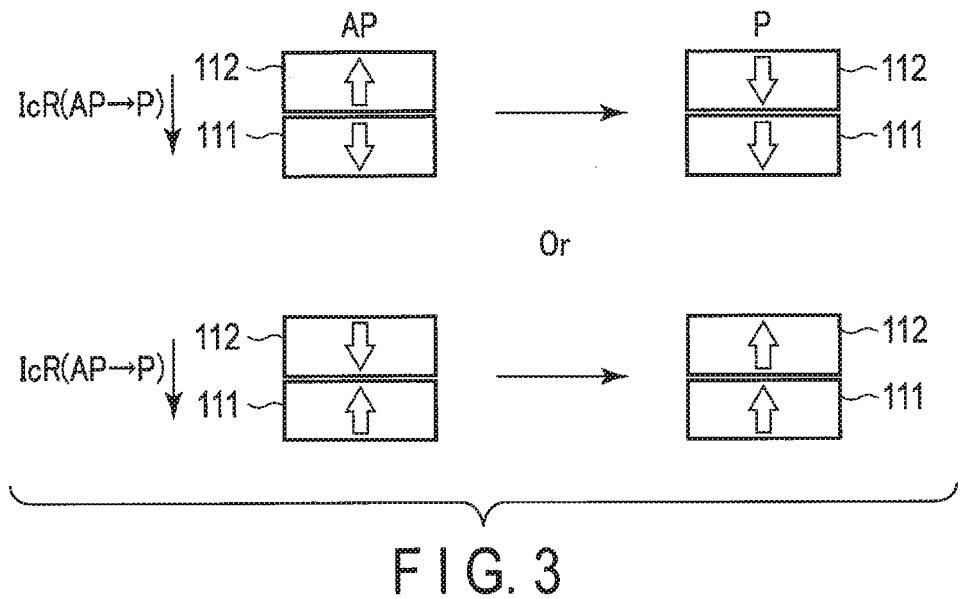
FIG. 3 illustrates states of the MTJ element of the logical operation circuit of the first embodiment and associated currents.
Figure 4:
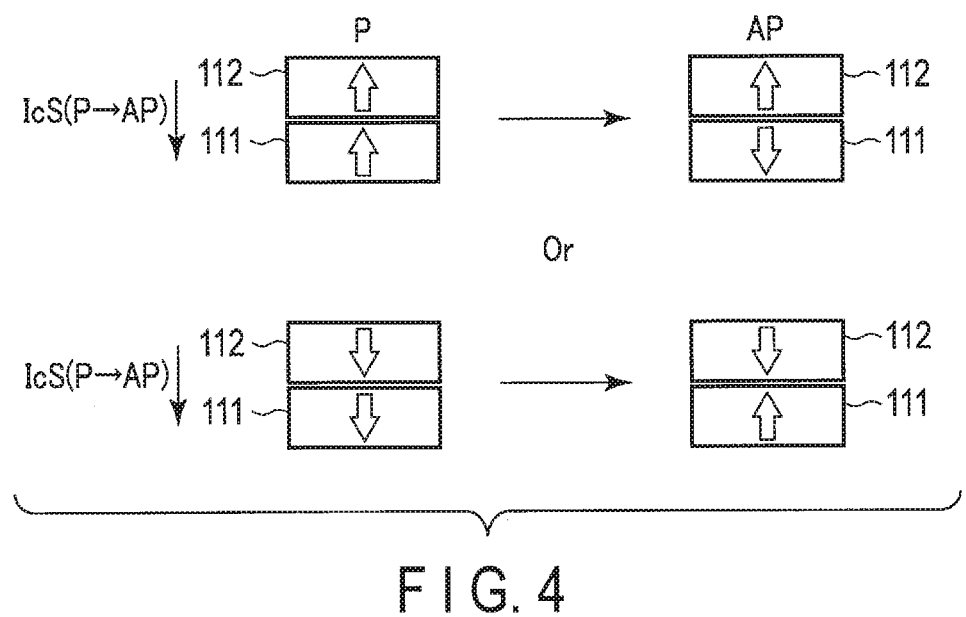
FIG. 4 illustrates states of the MTJ element of the logical operation circuit of the first embodiment and associated currents.

As illustrated in FIG. 3, when a switching current IcR (AP→P) of a particular magnitude flows through the MTJ element 12 in the AP state from the magnetic layer 112 to the magnetic layer 111, the orientation of the magnetization of the magnetic layer 111 flips, and the MTJ element 11 comes to be in the P state. Similarly, as illustrated in FIG. 4, when a switching current IcS(P→AP) of a particular magnitude flows through the MTJ element 11 in the P state from the magnetic layer 112 to the magnetic layer 111, the orientation of the magnetization of the magnetic layer 111 flips, and the MTJ element 11 comes to be in the AP state.

The MTJ element 11 is configured to allow the switching currents IcR(AP→P) and IcS(P→AP) to fulfill conditions 1 to 4, which will be described later. The switching currents (IcR(AP→P) and IcS(P→AP)) can be adjusted with various properties of the MTJ element 11. The factors for adjustment include the coercivities of the magnetic layers 111 and 112, and compositions thereof. The adjustment of the coercivities and/or compositions of the magnetic layers 111 and 112 can give the MTJ element 11 a desired switching. In general, magnetic layers including the magnetic layers 111 and 112 can have the switching currents adjusted through properties described in the following.

Firstly, a magnetic layer of a larger volume has a larger coercivity. With this feature used, the magnetic layers 111 and/or 112 have volumes selected to exhibit desired switching currents.

Secondly, it is known that when the Fe concentration in cobalt-iron-boron (CoFeB) is used as the horizontal axis and the switching current of an MTJ element which includes a layer of CoFeB plotted along the vertical axis, the resultant curve has a mountainous shape spreading along the horizontal axis. With this feature used, the magnetic layers 111 and/or 112 include or consist of CoFeB and include Fe of a concentration selected to exhibit desired switching currents.

Thirdly, it is known that a layer of CoFeB containing more Pt has a larger switching current. With this feature used, the magnetic layers 111 and/or 112 include CoFeB and are added with Pt of a concentration selected to exhibit desired switching currents.

Fourthly, it is known that the structure of layers of Co and Pt with a higher ratio of Pt has a larger switching current. With this feature used, the magnetic layers 111 and/or 112 include or consist of a structure of stacked layers of Co and Pt of a ratio selected to exhibit desired switching currents. The structure of the stacked layers may be an artificial grid, for example.

Two or more of the first to fourth factors may be combined.

(Operation)

Referring to FIGS. 5 to 15, operations of the logical operation circuit 1 will now be described. First, referring to FIG. 5, transitions of the states of the MTJ element 11 are described. Whenever the voltage V1 is applied between the magnetic layers 112 and 111 with the side of the magnetic layer 112 at a higher potential, the MTJ element 11 cyclically transitions among a state 1, a state 2, a state 3, and a state 4 in this order. The states 1 and 3 are the P state, and differ in the combination of the magnetization orientations of the magnetic layers 111 and 112. The states 2 and 4 are the AP state, and differ in the combination of the magnetization orientations of the magnetic layers 111 and 112.

With the application of the voltage V1 to the MTJ element 11 in the state 1, a shift current IS1(P) of a particular magnitude flows from the magnetic layer 112 to the magnetic layer 111. The shift current IS1(P) has a magnitude which fulfills the condition 1.

$$IcS(P\rightarrow AP)\times 1.5 < IS1(P) \qquad \text{Condition 1}$$

The condition 1 is a condition which the current IS1(P) should fulfill to transfer the MTJ element 11 from the state 1 (or 3) to the state 2 (or 4). The voltage V1 has a magnitude to pass a shift current IS1(P) which fulfills the condition 1 through the MTJ element 11 when applied to the MTJ element 11 in the AP state. In other words, the voltage V1 is determined and the MTJ element 11 is configured to fulfill the condition 1. The flow of the shift current IS1(P) transfers the MTJ element 11 in the state 1 to the state 2.

The phenomenon and result which occur in the process of the transition from the state 1 to the state 2 are the same as those in the general MTJ element, and the same as those when the shift current IS1(P) flows through the MTJ element in the P state to transfer the MTJ element to the AP state (to be referred to as an AP write, hereinafter). The details are as follows. With the AP write, an electron flow flows from the magnetic layer 111 to the magnetic layer 112. The majority of electrons which have passed the magnetic layer 111 have a spin of the same direction as the orientation of the magnetization, of the magnetic layer 111 (downward), and the remaining minority have a spin of the direction opposite to the orientation of the magnetization of the magnetic layer 111. The majority electrons, which have the spins of the same direction as the magnetization orientation of the magnetic layer 111, enter the magnetic layer 112, and only pass the magnetic layer 112. In contrast, the minority electrons, which have the spins of the direction opposite to the magnetization orientation of the magnetic layer 111, are reflected by the magnetic layer 112 to come back to the magnetic layer 111 to flip the magnetization, orientation of the magnetic layer 111 upward.

With the application of the voltage V1 to the MTJ element 11 in the state 2, a shift current IS1(AP) of a particular magnitude flows from the magnetic layer 112 to the magnetic layer 111, or an electron flow which has the same magnitude as and heads opposite to the current IS1(AP) flows. The shift current IS1 (AP) is smaller than the shift current IS1(P). This is because the MTJ element 11 in the AP state has the larger resistance than the resistance of the MTJ element 11 in the P state. The shift current IS1(AP) and the switching current IcR(AP→P) fulfill the condition 2.

$$IcR(AP\rightarrow P)\times 1.5 < IS1(AP) \qquad \text{Condition 2}$$

In other words, the voltage V1 is determined and the switching current IcR(AP→P) and by extension the MTJ element 11 are configured to fulfill the condition 2. The condition 2 is a condition which the current IS1(AP) should fulfill to transfer the MTJ element 11 from the state 2 (or 4) to the state 3 (or 1).

The minority electrons in the electron flow flowing by the application of the voltage V1 have a downward spin, and enter the magnetic layer 112 to only pass the magnetic layer 112. In contrast, the majority electrons have an upward spin, and ones of the upward-spin electrons are reflected by the magnetic layer 112, and the remaining ones enter the magnetic layer 112. Then, the upward-spin electrons which have entered the magnetic layer 112 flip the magnetization orientation of the magnetic layer 112 upward. As a result, the MTJ element 11 transitions from the state 2 to the state 3.

The transition from the state 3 to the state 4 is the same as the transition from the state 1 to the state 2 and only differs in the directions of the spins and the magnetization orientations of the magnetic layers 111 and 112. The transition from the state 4 to the state 1 is the same as the transition from the state 2 to the state 3 and only differs in the directions of the spins and the magnetization orientations of the magnetic layers 111 and 112.

As described, the shift current IS1(P) or IS1(AP) flows from the magnetic layer 112 to the magnetic layer 111 at every time of application of the voltage V1 to the MTJ element 11, and the shift current IS1(P) or IS1(AF) flips the resistance state of the MTJ element 11. Thus, any transition of the MTJ element 11 is possible by the current of one direction. For this reason, the write drivers 12 and 13 only need to pass the current of one direction through the MTJ element 11.

Figures 5, 6:
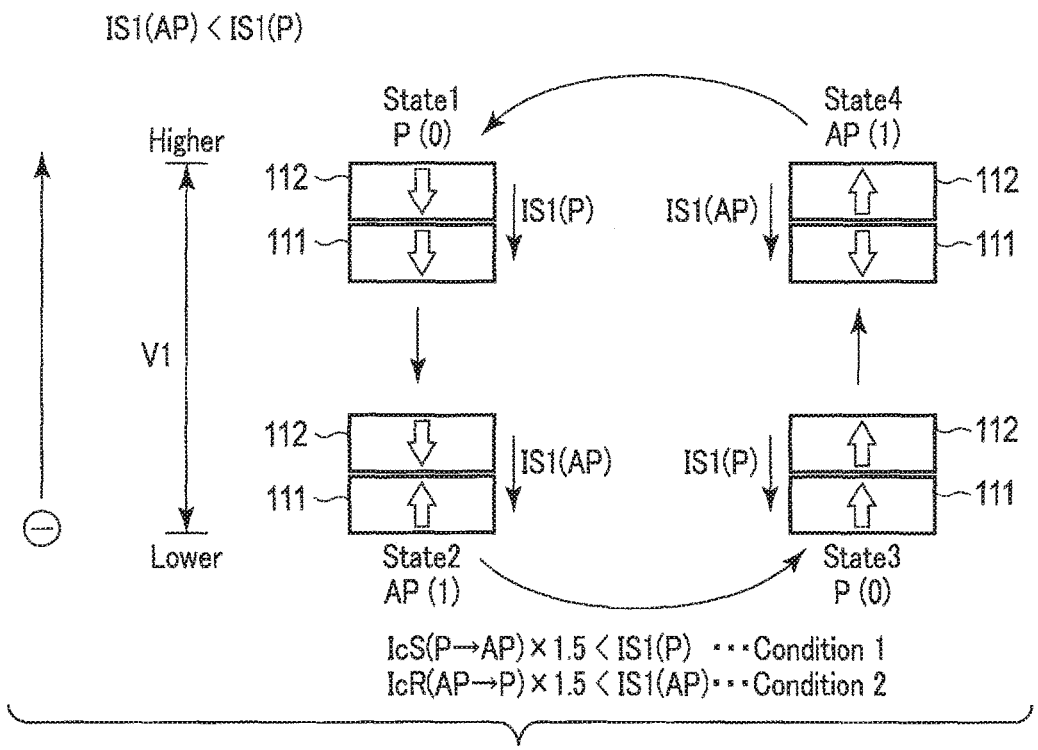
FIG. 5 illustrates an example of transitions of the states of the MTJ element of the logical operation circuit of the first embodiment.
FIG. 6 illustrates a first example of correspondence between an input and an output of the logical operation circuit of the first embodiment.

Note that the current through the MTJ element 11 in the P state from the magnetic layer 112 to the magnetic layer 111 cannot flip the magnetization orientation of the magnetic layer 112 to transfer the MTJ element 11 to the AP state, or, from the state 1 (or 3) to the state 4 (or 2). This is because, due to the properties of the MTJ elements, a magnetic layer at the upstream of flowing electrons tends to become the AP state and a magnetic layer at the downstream tends to become the P state in general. When the electrons flow through the MTJ element 11 in the P state from the magnetic layer 111 to the magnetic layer 112 as shown in FIG. 5, the magnetic layer 111 is the upstream side and hence it first flips to make the MTJ element 11 the AP state. Therefore, with the current flowing from the magnetic layer 112 to the magnetic layer 111, the transition from the state 1 (or 3) to the state 2 (or 4) occurs, and the transition from the state 1 (or 3) to the state 4 (or 2) does not occur, as described above.

Note that when the direction of the current is opposite to that in FIG. 5, i.e., from the magnetic layer 111 to the Magnetic layer 112, the direction in which the states shift is reversed. Specifically, the state 1 transitions to the state 4, the state 4 transitions to the state 3, the state 3 transitions to the state 2, the state 2 transitions to the state 1, and the state 1 transitions to the state 4.

Referring to FIGS. 6 to 15, the operations of the whole logical operation circuit 1 will now be described. The following description is based on an example where the MTJ element 11 in the P state stores digital "0" data, and the MTJ element 11 in the AP state stores digital "1" data. The relationship between the states and data may be contrary to this example.

The table of FIG. 6 is obtained from the combinations of execution or non-execution of the application of the voltage V1 to the MTJ element (presence or absence of flow of the shift current IS1, or IS1(AP) or IS1(P)) and states of the MTJ element 11 before and after the application of the voltage V1. The rows indicate two cases based on the logic of a signal Vsw1. The signal Vsw1 indicates the instruction of execution or non-execution of application of the voltage V1 by the controller 16. The row of 0 indicates the non-execution of the application of the voltage V1, and the row of 1 indicates the execution of the application of the voltage V1. The column of 0 indicates that the MTJ element 11 stores "0" data before the application of the voltage V1 (or, it is in the P state), and the column of 1 indicates that the MTJ element 11 stores "1" data before the application of the voltage V1 (or, it is in the AP state). The value at the intersection of a row and a column indicates the data in the MTJ element 11 after the application of the voltage V1.

Without the application of the voltage V1, the MTJ element 11 maintains the state before the application. In contrast, the application of the voltage V1 passes the shift current IS1(AP) or IS1(P) through the MTJ element 11 to flip the state of the MTJ element 11. The table of FIG. 6 is the same as the truth table of the exclusive OR (XOR) operation. Therefore, an XOR operation can be performed by the logical operation circuit 1. The first input of the operation indicates the execution and the non-execution of the application of the voltage V1 as 0 and 1, respectively, and the second input indicates the P and AP states of the MTJ element 11 before the execution of application of the voltage V1 as 0 and 1, respectively. The resistance state of the MTJ element 11 after the application of the voltage V1 is read using the sense amplifier circuit 14a. The output OUT is 0 when the MTJ element 11 is in the P state; and the output OUT is 1 when the MTJ element 11 is in AP state.

The controller 16 associates the input signal IN1 with the execution or the non-execution of the application of the voltage V1, and associates the input signal IN2 with the execution of the application of the voltage V1 to the MTJ element 11 in the P state or the execution of the application of the voltage V1 to the MTJ element 11 in the AP state. Based on the logics of the input signals IN1 and IN2, the controller 16 controls the write drivers 12 and 13 to apply the voltage V1 to the MTJ element 11 in the AP or P state, or does not apply the same (for example, it performs nothing for a time required for the application of the voltage V1). The controller 16 uses the MTJ element 11 in the P state when the input signal IN2 is 0, and uses the MTJ element 11 in the AP state when the input signal IN2 is 1. The controller 16 then controls the sense amplifier circuit 14a to read the data from the MTJ element 11. The read data is carried by the signal OUT and is the result of the XOR operation.

As described above, the voltage V1 is selected to pass the current. IcS(P→AP) which fulfills the condition 1 (IcS(P→AP)×1.5<IS1(P)) through the MTJ element 11 in the P state when applied to the MTJ element 11. The fulfillment, of the condition 1 allows the transition from the state 1 to the state 2 or from the state 3 to the state 4 to occur. The application to the MTJ element 11 of a voltage lower than the voltage V1 can cause the MTJ element 11 to behave differently from FIG. 5.

Figure 7:
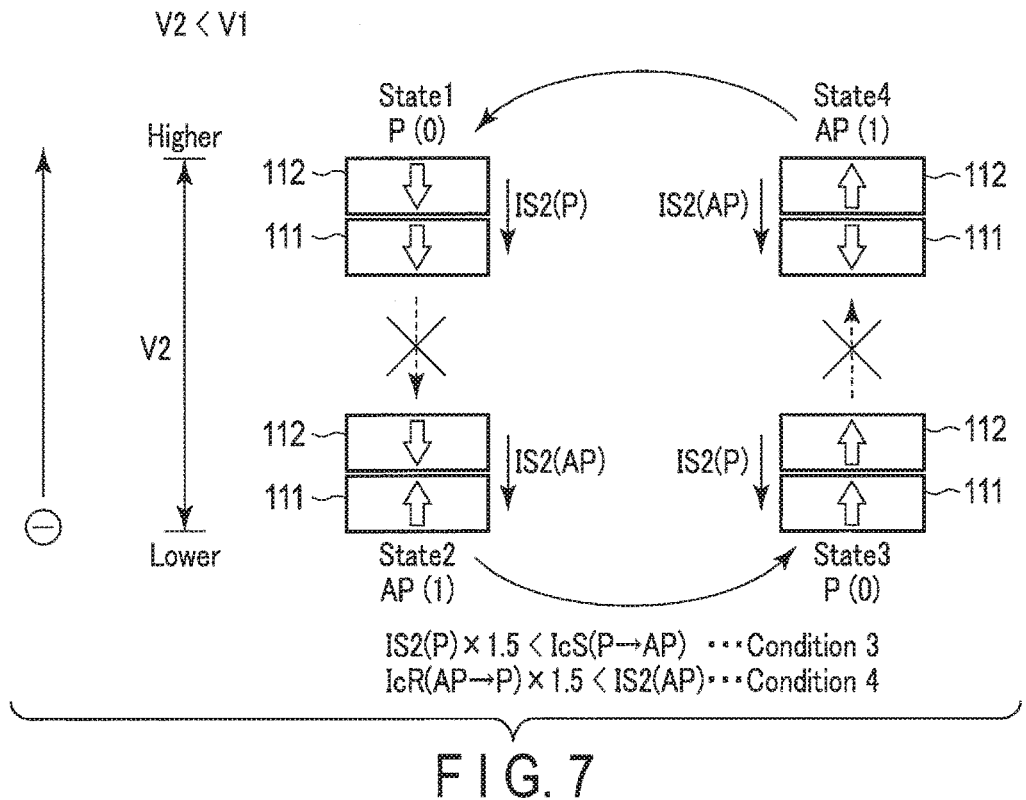
FIG. 7 illustrates an example of other transitions of the states of the MTJ element of the logical operation circuit, of the first embodiment.

FIG. 7 illustrates an example of transitions of the states of the MTJ element 11 based on execution of application of the voltage V2 to the MTJ element 11. The application of the voltage V2 to the MTJ element 11 in the state 1 passes a shift current IS2(P) of a particular magnitude from the magnetic layer 112 to the magnetic layer 111. The shift current IS2(P) has a magnitude which fulfills condition 3, and the voltage V2 has a magnitude to pass the shift current IS2(P) which fulfills the condition 3 through the MTJ element 11 when applied to the MTJ element 11 in the AP state.

$$IS2(P) \times 1.5 < IcS(P \rightarrow AP) \qquad \text{Condition 3}$$

Such a flow of the shift current IS2(P) does not have a magnitude sufficient to transfer the MTJ element 11 in the state 1 to the state 2. Therefore, the application of the voltage V2 to the MTJ element 11 in the P state does not transfer the MTJ element 11 from the state 1 to the state or from the state 3 to the state 4. In other words, the condition 3 is a condition which should be fulfilled in order for the current IS2(P) not to transfer the MTJ element 11 from the state 1 (or 3) to the state 2 (or 4). In contrast, the application of the voltage V2 to the MTJ element 11 in the state 2 passes a shift current IS2(AP) of a particular magnitude from the magnetic layer 112 to the magnetic layer 111. The shift current IS2(AP) is smaller than the shift current IS2(P). The shift current IS2(AP) has a magnitude which fulfills condition 4.

$$IcR(AP \rightarrow P) \times 1.5 < IS2(AP) \qquad \text{Condition 4}$$

The voltage V2 has a magnitude to pass the shift current IS2(AP) which fulfills the condition 4 through the MTJ element 11 when applied to the MTJ element 11 in the AP state. In other words, the voltage V2 is determined and the switching current IcR(AP→P) and by extension the MTJ element 11 are configured to fulfill the condition 4. The flow of the shift, current IS2(AP) transfers the MTJ element 11 in the state 2 to the state 3. In other words, the condition 4 is a condition which should be fulfilled in order for the current IS2(AP) to transfer the MTJ element 11 from the state 2 (or 4) to the state 3 (or 1).

Figure 8:
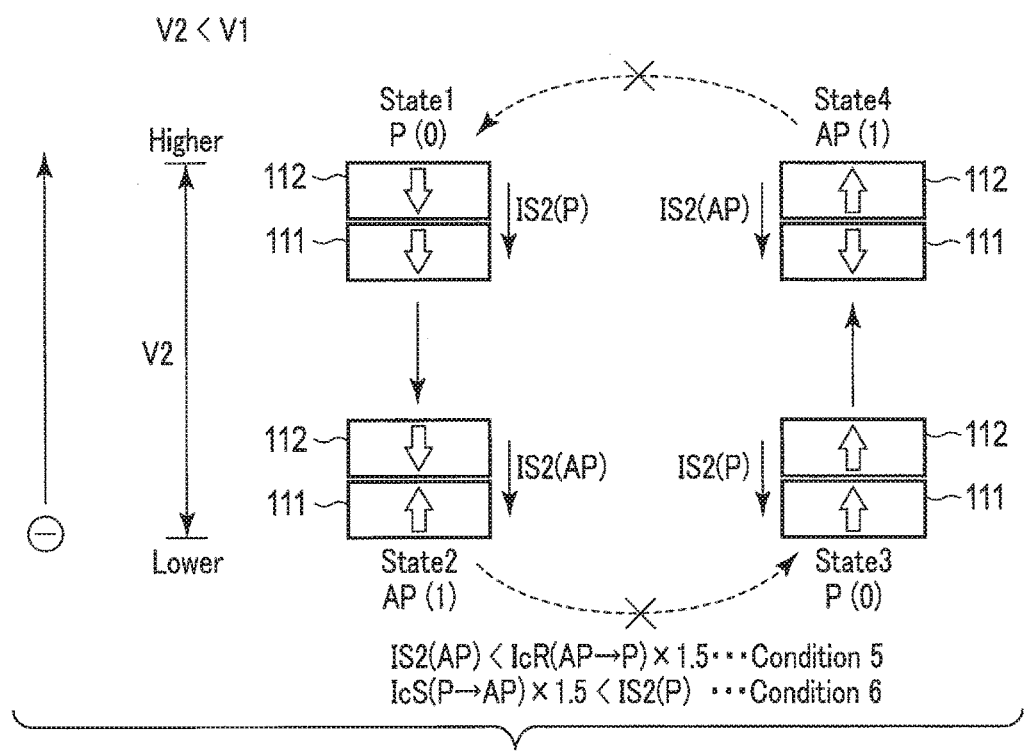
FIG. 8 illustrates an example of still other transitions of the states of the MTJ element of the logical operation circuit of the first embodiment.

The description has been given of the case where the MTJ element 11 is not transferred from the state 1 to the state 2 or from the state 3 to the state 4. However, as shown in FIG. 8, the voltage can be controlled and the MTJ element 11 can be configured not to cause the shift from the state 2 to the state 3 or from the state 4 to the state 1. In this case, conditions 5 and 6 need to be fulfilled instead of the conditions 3 and 4.

$$IS2(AP) < IcR(AP \rightarrow P) \times 1.5 \qquad \text{Condition 5}$$

$$IcS(P \rightarrow AP) \times 1.5 < IS2(P) \qquad \text{Condition 6}$$

In this case, the MTJ element 11 in the P state is associated with storing of digital "1" data, and the MTJ element 11 in the AP state is associated with storing of digital "0" data. The operations based on such association are the same as those when the AP and P states are respectively associated with "1" data and "0" data and the MTJ element 11 is not transferred from the state 1 to the state 2 or from the state 3 to the state 4.

The condition 5 is a condition which should be fulfilled in order for the current IS2(AP) not to transfer the MTJ element 11 from the state 2 (or 4) to the state (or 1). The condition 6 is a condition which should be fulfilled in order for the current IS2(P) to transfer the MTJ element 11 from the state 1 (or 3) to the state 2 (or 4).

The description will be given, of the case where the MTJ element 11 is not transferred from the state 1 to the state 2 and from the state 3 to the state 4 in the following.

The table of FIG. 9 is obtained from the same combinations as FIG. 6 for the case of the voltage V2. The rows indicate two cases based on the logic of a signal Vsw2. The signal Vsw2 indicates the instruction of execution or non-execution of application of the voltage V2 (presence or absence of flow of the shift current IS2, or IS2(AP) or IS2(P)) by the controller 16.

Based on the logic of the input signals IN1 and IN2, the controller 16 controls the write drivers 12 and 13 to apply the voltage V2 to the MTJ element 11, or does not apply it.

When the logic of the first input IN1 in the case of the application of the voltage V2 is associated with the converse relationship between the execution or non-execution of the application of the voltage V2, the table of FIG. 10 is obtained. The table of FIG. 10 is the same as the truth table of the logical product (AND). In order obtain the output of FIG. 10, the controller 16 applies the voltage V2 when the logic of the first input IN1 is 0, and does not apply the voltage V2 when the logic is 1. Similarly, when the logic of the first input IN1 in the case of the application of the voltage V1 is associated with the converse relationship between the execution non-execution of the application of the voltage V1, the table of FIG. 11 is obtained.

Figure 13:
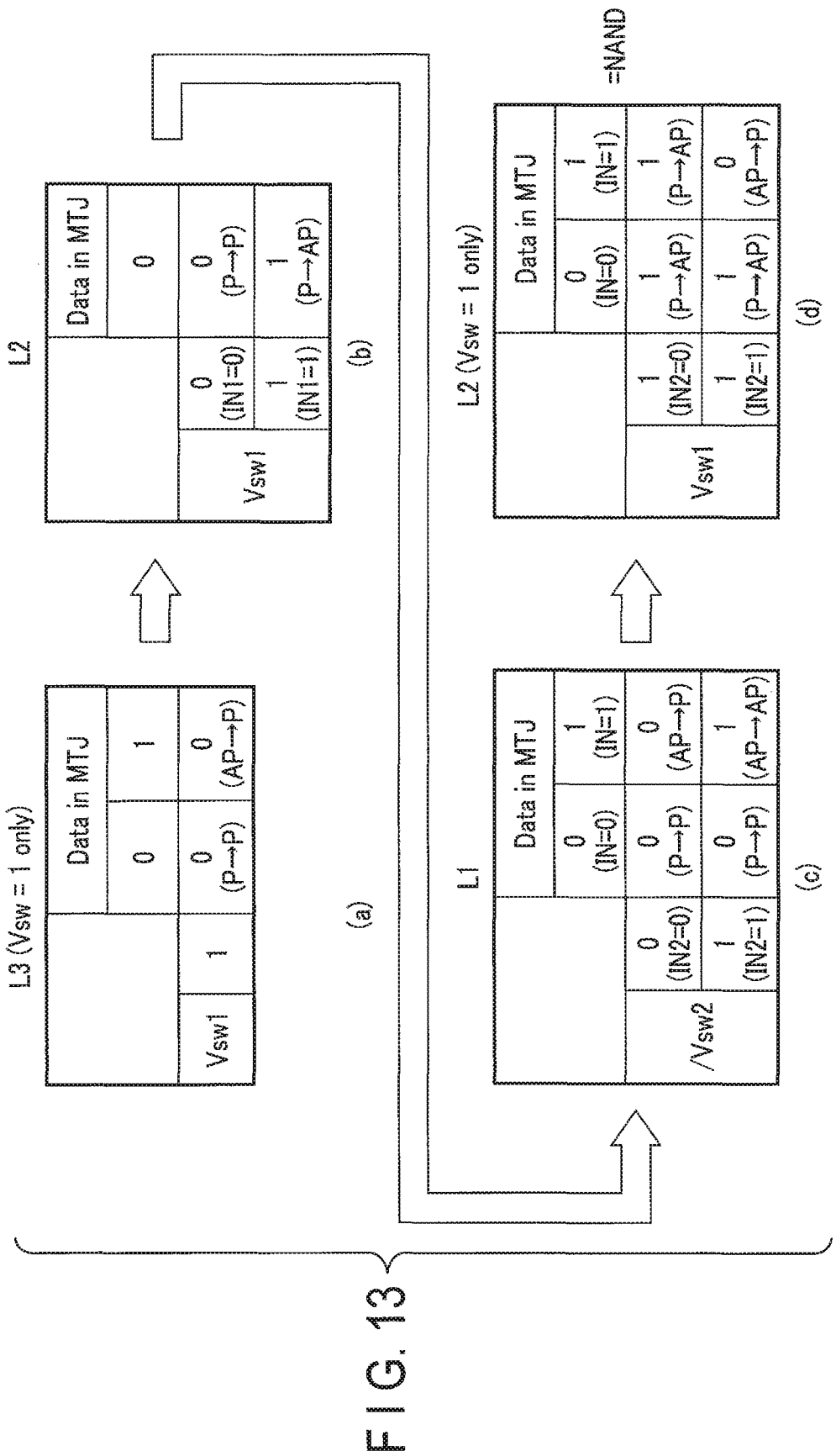
FIG. 13 illustrates another example of steps and states in the course of an operation by the logical operation circuit, of the first embodiment.

Combining some of operations for obtaining outputs of FIGS. 6 and 9 to 11 can perform the negative logical addition (NOR) operation and negative logical product (NAND) operation. FIG. 12 illustrates the steps and states for the NOR operation by the logical operation circuit 1. FIG. 13 illustrates the steps and states for the NAND operation by the logical operation circuit 1. The processes to obtain the states illustrated in FIGS. 10, 6, 9, and 11 through the execution or non-execution of the voltage V1 or V2 will be hereinafter referred to as L1, L2, L3, and L4 processes, respectively. The truth tables by L1, L2, L3, and L4 processes are shown in FIGS. 12(a), (b), (c), and (d), respectively.

As illustrated in FIG. 12, the controller 16 controls the write drivers 12 and 13 to perform the L3 process with Vsw=1, i.e., to apply the voltage V1 to the MTJ element 11, to initialize the MTJ element 11. As a result, whether the MTJ element 11 is in the AP state or P state, it transitions to the P state. The result of the L3 process is illustrated in FIG. 12(e).

The controller 16 then controls the write drivers 12 and 13 to perform the L4 process to the MTJ element 11. In the L4 process, the controller 16 applies or does not apply the voltage V1 to the MTJ element 11, based on the logic of the input signal IN1. When the logic of the input signal IN1 is 0, the MTJ element 11 is applied with the voltage V1 to transition to the AP state. In contrast, when the logic of the input signal IN1 is 1, the MTJ element 11 is not applied with the voltage V1 and stays in the P state. The result of the L4 process is illustrated in FIG. 12(f).

The controller 16 then controls the write drivers 12 and 13 to perform the L3 process to the MTJ element 11. In the L3 process, the controller 16 applies or does not apply the voltage V2 to the MTJ element 11 based on the logic of the input signal IN2. When the logic of the input signal IN2 is 0, the MTJ element 11 is not applied with the voltage V2 and stays in the state prior to the 13 process. In contrast, when the logic of the input signal IN2 is 1, the MTJ element 11 is applied with the voltage V2, and if it is in the AP state, it transitions to the P state, or if it is in the P state, it stays at the P state. Such combinations of the different outputs resulting from the combinations of the logic of the input signals IN1 and IN2 are the same as the truth table of the NOR operation, as illustrated in FIG. 12(g).

Finally, the controller 16 controls the sense amplifier circuit 14a to read the data from the MTJ element 11 (or determines the state of the MTJ element 11) to output the read data as the signal OUT, which indicates the result of the logical operation to the outside of the logical operation circuit 1.

Similarly, as illustrated in FIG. 13(a), the L3 process with Vsw=1 is performed and the MTJ element 11 is initialized. As illustrated in FIG. 13(b), the L2 process based on the input signal IN1 is then performed, i.e., when the logic of the input signal IN1 is 1, the voltage V1 is applied to the MTJ element 11. As illustrated in FIG. 13(c), the L1 process based on the input signal IN2 is then performed, i.e., when the logic of the input signal IN2 is 0, the voltage V2 is applied to the MTJ element 11. Furthermore, as illustrated in FIG. 13(d), the L2 process with Vsw=1, i.e., the application of the voltage V1 to MTJ element 11, is performed. Such combinations of different outputs resulting from the combinations of the logic of the input signals IN1 and IN2 are the same as the truth table of the NAND operation, as illustrated in FIG. 13(d). Finally, the controller 16 outputs the result based on the state of the MTJ element 11 to the outside of the logical operation circuit 1.

It is known that combinations of the NOR operation and the NAND operation can realize all kinds of known logical operations on digital signals. Therefore, the logical operation circuit 1 can perform all kinds of logical operations. To this end, the controller 16 can store inputs of logical operations and intermediate results in the latch circuit 16a.

(Advantages)

As described above, according to the logical operation circuit 1 of the first embodiment, with components the same as or similar to components in the MRAMs, all kinds of known logical operations can be performed.

(Modification)

Figure 14:
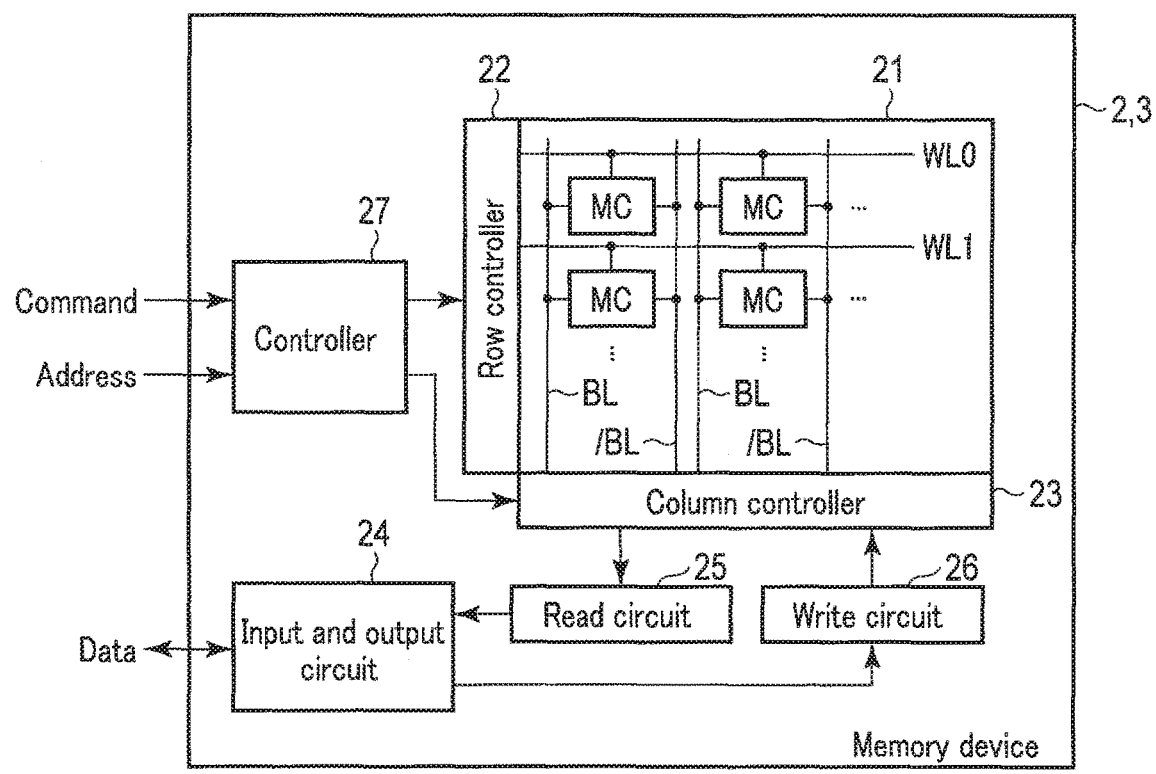
FIG. 14 illustrates functional blocks of a memory device of a modification of the first embodiment.

The function of the logical operation circuit 1 may be added to an MRAM. Specifically, components in an MRAM are used to implement the functionalities of the logical operation circuit 1. FIG. 14 relates to the modification of the first embodiment and illustrates functional blocks of a memory device 2 of the first embodiment. The logical operation circuit 1 can be based on the memory device 2.

The memory device 2 is an MRAM, and includes a memory cell array 21, the row controller 22, a column controller 23, an input and output circuit 24, a read circuit 25, a write circuit 26, and a controller 27.

Figure 15:
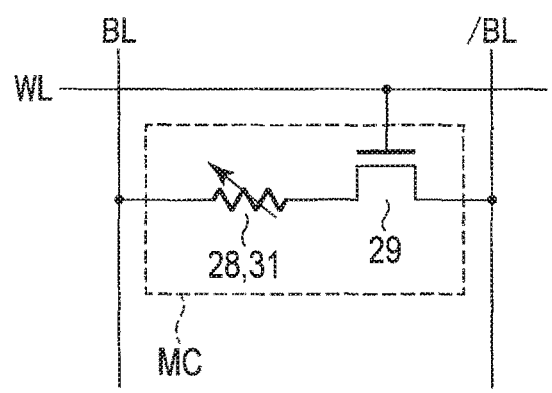
FIG. 15 illustrates components and connections of a memory cell of the memory device of the modification of the first embodiment.

The memory cell array 21 includes plural memory cells MC. The memory cells MC are arranged in a matrix. The memory cell array 21 is provided with pairs of bit lines BL and /BL, and word lines WL (WL0, WL1, . . . ). Each memory cell MC includes an MTJ element 28 and a select transistor 29 as illustrated in FIG. 15. The select transistor an n-type MOSFET, for example. One end of the MTJ element 28 is coupled to a bit line BL, and the other end is coupled to the drain of the select transistor 29. The select transistor 29 is coupled to a word line WL at the gate, and coupled to a bit line/BL at the source. One bit line pair, and components coupled to that bit line pair belong to one column.

Referring back to FIG. 14, the row controller 22 is coupled to the word lines WL, and selects one of the word lines WL based on a row address. The row address is included in an address signal and/or a command from the outside of the memory device 2.

The column controller 23 is coupled to the bit line pairs BL and /BL. The column controller 23 selects one of the pairs of the bit lines BL and /BL based on a column address, and couples a selected bit line pair to the read circuit 15 or the write circuit 16. The column address is included in the address signal and/or a command.

The read circuit 15 passes a current via a selected memory cell MC through a selected bit line BL, and reads the data stored in the selected memory cell MC based on the current. The read circuit 15 supplies the read data to the input and output circuit 24. The write circuit 15 applies a voltage to the selected memory cell MC through a selected bit line pair, and passes a write current through the selected memory cell MC. The write current is oriented in the direction according to the data to be written. With the write current, data is written in the selected memory cell MC.

The input and output circuit 24 transmits write data received from the outside of the memory device 2 to the write circuit 26, and outputs read data received from the read circuit 25 to the outside of the memory device 2.

The controller 27 receives the address signal and commands from the outside of the memory device 2. The controller 27 follows the signal and commands to control other components 22 in the memory device 2, such as the row controller 22, the column controller 23, the read circuit 25, and the write circuit 26, to perform various operations of the memory device 2, such as a read and a write.

Figure 16:
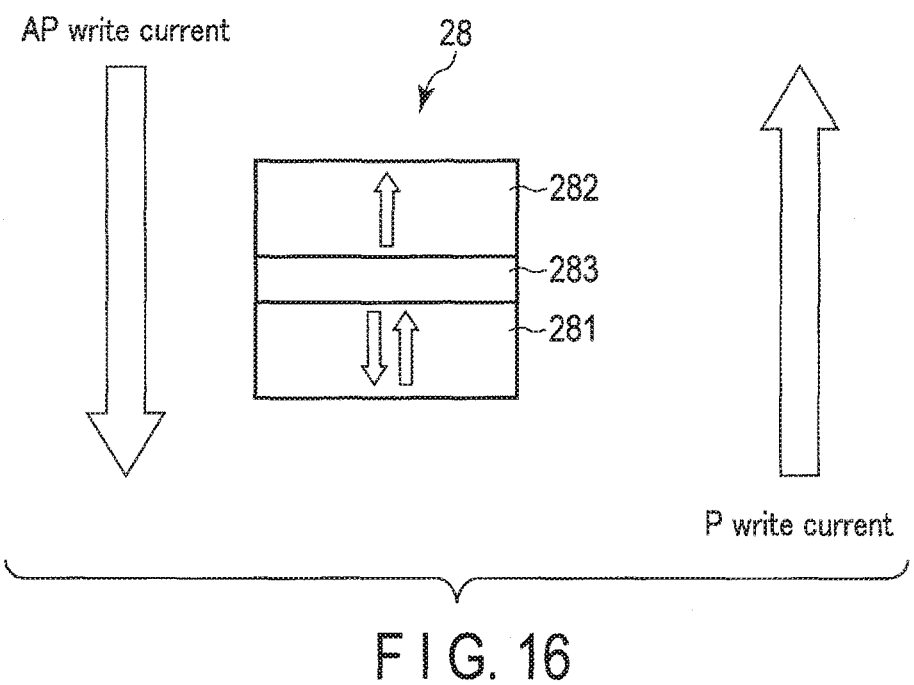
FIG. 16 illustrates the structure of an MTJ element of the memory device of the modification of the first embodiment.

The MTJ element 28 has the structure, for example, illustrated in FIG. 16. As illustrated in FIG. 16, the MTJ element 28 includes an MTJ, and includes magnetic layers 281 and 282 and an intermediate layer 283 between the magnetic layers 281 and 282. The intermediate layer 283 serves as a tunnel barrier. The magnetic layers 281 and 282 have the perpendicular magnetic anisotropy. The magnetization (indicated by the arrows) of the magnetic layer 281 can stabilize in one of the two directions along the magnetization easy axis.

The AP state and P state of the MTJ element 28 are associated with the two values of digital data, which allows data to be stored in the MTJ element 28 in a non-volatile manner.

When a write current of a particular magnitude flows from the magnetic layer 282 to the magnetic layer 281, the magnetization orientations of the magnetic layers 281 and 282 become parallel. When a write current of a particular magnitude flows from the magnetic layer 281 to the magnetic layer 282, the magnetization orientations of the magnetic layers 281 and 282 become anti-parallel. The current which makes the magnetization orientations of the magnetic layers 281 and 282 parallel is hereinafter referred to as a P write current. The current which makes the magnetization orientations of the layers 281 and 282 antiparallel is hereinafter referred to as an AP write current. The AP write current is smaller than the shift current IS2(AP), which is smallest among the shift currents.

The P or AP write current flips the magnetization orientation of the magnetic layer 281, and the orientation of the magnetization of the magnetic layer 281 is used to store data. The magnetic layer 281 may be hereinafter referred to as a storage layer 281 in contrast, a switching current to flip the magnetization orientation of the magnetic layer 282 is larger than the switching current the magnetic layer 281. Therefore, the P and AP write currents do not flip the magnetization orientation of the magnetic layer 282. The magnetic layer 282 does not have the magnetization orientation flipped during the operation of the MTJ element 28 as a memory cell (operation in which no current exceeding the AP write current flows). The magnetic layer 282 may be hereinafter referred to as a reference layer 282.

The MTJ element 28 can serve also as the MTJ element 11. In this case, the storage layer 281 serves as the magnetic layer 111 of the MTJ element 11, and the reference layer 282 serves as the magnetic layer 112 of the MTJ element 11. To this end, as is the MTJ element 11, the MTJ element 28 is configured to sequentially and cyclically take the states 1 to 4 when applied with the voltage V1 at the both ends and transition from the state 4 to state 1 and from state 2 to state 3 when applied with the voltage V2 at the both ends.

In order for the memory device 2 to implement the functionalities of the logical operation circuit 1, the controller 27 can perform the functionalities of the controller 16 and include the components included in the controller 16. Moreover, the write circuit 26 can perform the functionalities of the write drivers 12 and 13, and the read circuit 27 can perform the functionalities of the read circuit 14.

According to the modification, the memory device 2 can have functionalities of the logical operation circuit 1 as well as the functionalities as a memory device.

Second Embodiment

The second embodiment relates to implementation of logical operations through components usually included in the MRAMs, like the example of the modification and application of the first embodiment.

(Structure, Configuration)

The memory device 3 of the second embodiment has functional blocks illustrated in FIG. 14. It, however, differs from the memory device 2 of the modification of the first embodiment in the features of the MTJ elements, components and connections of the write circuit 26, and the operations of the controller 27 as described in the following. The memory device 3 includes an MTJ element 31 instead of the MTJ element 28 included in the memory device 2.

Figure 17:
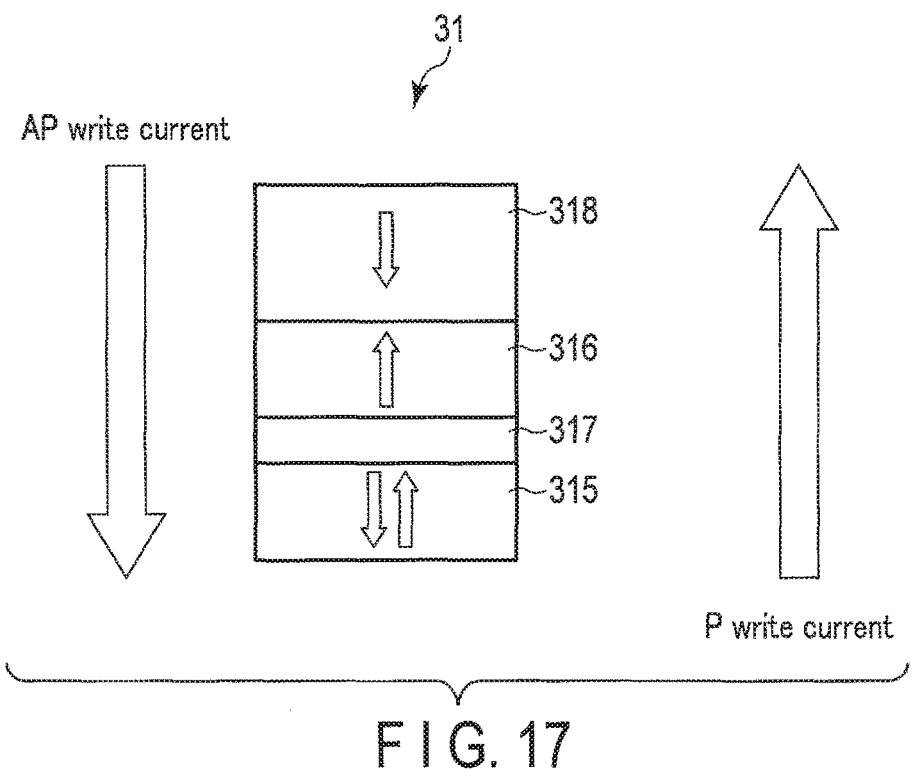
FIG. 17 illustrates the structure of an MTJ element of a memory device of a second embodiment.

The MTJ element 31 of the memory cell MC has the same features as an ordinary MTJ element used in the MRAMs. Specifically, as illustrated in FIG. 17, the MTJ element 31 includes at least a storage layer 315, a reference layer 316, and an intermediate layer 317 as the MTJ element 28 (see, FIG. 16). The layers 315, 316, and 317 have the same features as the layers 281, 282, and 283, respectively. The MTJ element 31, however, does not need to have features for transitioning among the states 1, 2, 3, and 4 at every time of supply of the shift current IS1 and/or IS2 unlike the first embodiment. Based on this, the layers 315, 316, and 317 do not need to have the features for transition among the states by the shift current IS1 and/or IS2 unlike the layers 281, 282, and 283. The MTJ element 31 may include additional layers, and, for example, includes a magnetic layer 318. The magnetic layer 318 has a function to cancel the magnetic field generated by the reference layer 316, and eases a bias in which the magnetization orientation of the storage layer 315 easily becomes parallel to the magnetization orientation, of the reference layer 316 by the magnetic field of the reference layer 316. The magnetic layer 318 may be referred to as a shift cancel layer.

Figure 18:
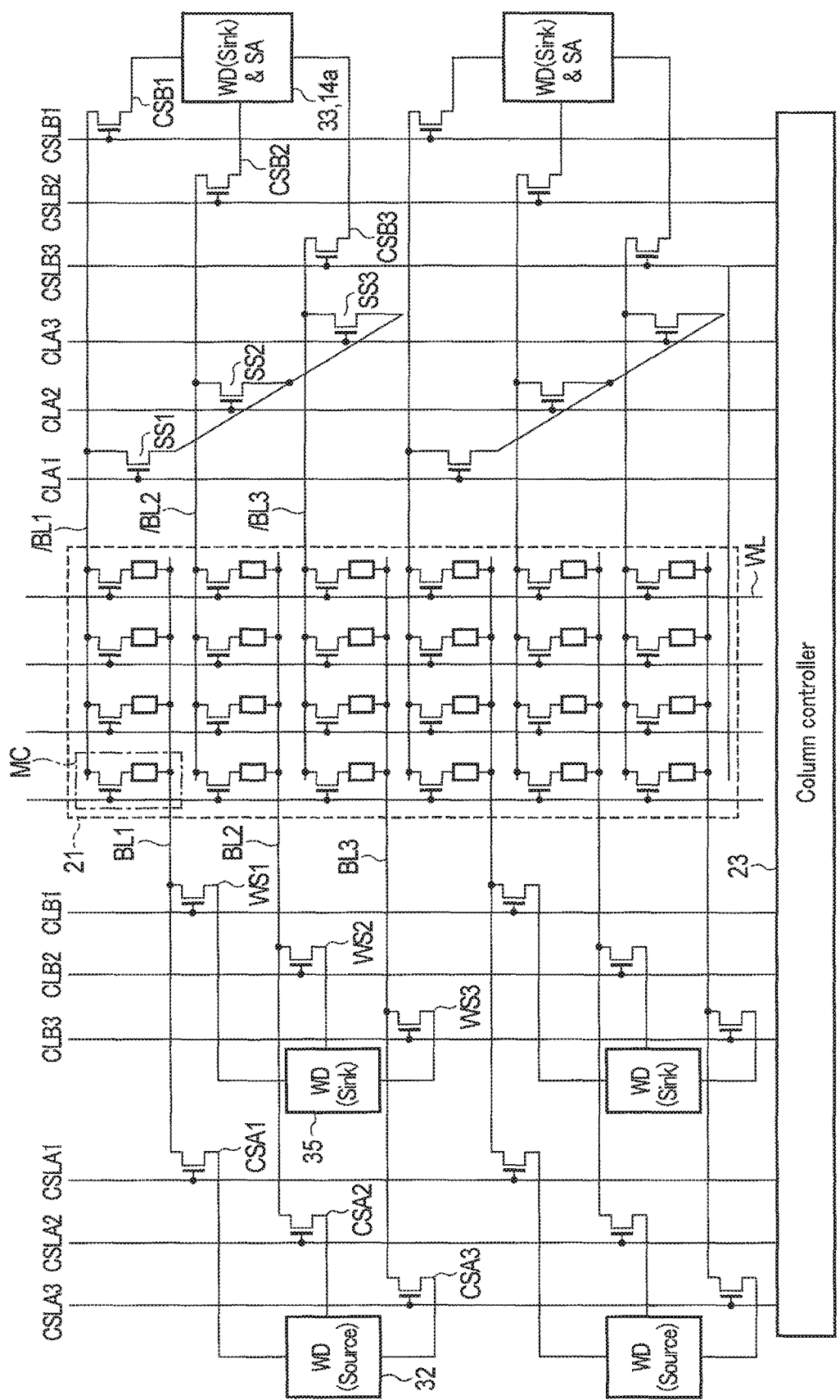
FIG. 18 illustrates some components and connections of the memory device of the second embodiment.

FIG. 18 illustrates components and connections of the memory cell array 21, a part of the write circuit 26, and a part of the read circuit 25 of the memory device 3 of the second embodiment. In units of three adjacent columns, the same structure is provided repeatedly. Each set of such three columns is hereinafter referred to as a column set. Each column set includes bit lines BL1, BL2, BL3, bit lines /BL1, /BL2, /BL3, and memory cells MC coupled to those bit lines. FIG. 18 and the following description are based on the example in which one column set includes three columns for simplification. The column set may, however, include four or more columns.

One column set shares one pair of write drivers 32 and 33, and one sense amplifier circuit 14a. The write drivers 32 and 33 are included in the write circuit 26.

In each column set, the bit lines BL1, BL2, and BL3 are coupled to the write driver 32 through column switches CSA1, CSA2, and CSA3, respectively. Each of the column switches CSA1 to CSA3 is an n-type MOSFET, for example. The gates of respective column switches CSA1 of respective column sets are coupled to a column select line CSLA1. The gates of respective column switches CSA2 of respective column sets are coupled to a column select line CSLA2. The gates of respective column switches CSA3 of respective column sets are coupled to a column select line CSLA3. The column select lines CSLA1 to CSLA3 are coupled to the column controller 23, and have the potentials controlled by the column controller 23.

In each column set, bit lines/BL1, /BL2, and /BL3 are coupled to the write driver 33 and the sense amplifier circuit 14a through column switches CSB1, CSB2, and CSB3, respectively. Each of the column switches CSB1 to CSB3 is an n-type MOSFET, for example. The gates of respective column switches CSB1 of respective column sets are coupled to a column select line CSLB1. The gates of respective column switches CSB2 of respective column sets are coupled to a column select line CSLB2. The gates of respective column switches CSB3 of respective column sets are coupled to a column select line CSLB3. The column select lines CSLB1 to CSLB3 are coupled to the column controller 23, and have potentials controlled by the column controller 23.

The column select lines CSLA1 and CSLB1 make a pair, and are specified by the column specified by a command for read. Similarly, the column select lines CSLA2 and CSLB2 make a pair, and the column select lines CSLA3 and CSLB3 make a pair.

In each column set, bit lines/BL1, /BL2, and /BL3 can be coupled to each other. Specifically, the bit lines/BL1 and /BL3 are coupled to each other through switches SS1 and SS3, the bit lines/BL2 and /BL3 are coupled to each other through switches SS2 and SS3, and the bit lines/BL1 and /BL2 are coupled to each other through switches SS1 and SS2. Each of the switches SS1 to SS3 is an n-type MOSFET, for example. The gates of respective switches SS1 to SS3 are coupled to the column controller 23 via a control line. For example, the transistor SS1 of each column set is coupled to a control line CLA1, the transistor SS2 of each column set is coupled to a control line CLA2, and the transistor SS3 of each column set is coupled to a control line CLA3. The control lines CLA1 to CLA3 have potentials controlled by the column controller 23.

The bit lines BL1, BL2, and BL3 of each column set can be further coupled to the write driver 35. Specifically, the bit lines BL1, BL2, and B3 are coupled to the write driver 35 through switches WS1, WS2, and WS3, respectively. The gates of switches WS1, WS2, and WS3 are coupled to the column controller 23 via control lines. For example, the transistors WS1 of respective column sets are coupled to a control line CLB1, the transistors WS2 of respective column sets are coupled to a control line CLB2, and the transistors WS3 of respective column sets are coupled to a control line CLB3. The control lines CLB1 to CLBA3 have potentials controlled by the column controller 23.

The write driver 32 can output voltages for the P write current and AP write current. The write drivers 32 and 33 coupled to one column set make a pair, and can apply voltages between the write drivers 32 and 33 in conjunction to pass the AP and P write current.

The write driver 32 can output the voltages V3 and V4. The write drivers 32 and 35 coupled to one column set make a pair, and can apply the voltages V3 and V4 between the write drivers 32 and 35 in conjunction.

(Operation)

Referring to FIGS. 19 to 22, operations of the memory device 3 of the second embodiment will be described. FIGS. 19 and 20 are based on FIG. 18. Transistors surrounded by circles of dashed lines are on in FIGS. 19 and 20.

FIG. 19 illustrates connections of components during a read by the memory device 3. For example, one word line WL specified by the command for read is activated (or, made high) by the row controller (not shown). The activated selected word line WL turns on select transistors 29 with gates coupled to the selected word line WL, and electrically couples memory cells MC including those select transistors 29 to respective pairs of bit lines BL and /BL.

Moreover, one pair of column select lines CSLA and CSLB (for example, column select lines CSLA1 and CSLB1) specified by the column specified by the command for read is activated (or, made high) by the column decoder 23. The activated column select line, CSLA turns on one or more transistors CSA (CSA1, CSA2, or CSA3) with gates coupled to the activated CSLA. Each of the turned-on transistors CSA couples the it line BL coupled to that transistor CSA to one write driver 32. For example, one bit line BL in each column set is coupled to the output of the write driver 32 for that column set.

Moreover, the activated column select line CSLB (CSLB1, CSLB2, or CSLB3) turns on one or more transistors CSE (CSB1, CSB2, or CSB3) with gates coupled to the activated CSLB. Each of the turned-on transistors CSB couples the bit line /BL coupled to that transistor CSB to one sense amplifier circuit 14a. For example, one bit line/BL in each column set is coupled to the input of the sense amplifier circuit 14a for that column set.

In the state where the transistors specified by the command are on as shown in FIG. 19, the controller 27 controls one or more pairs of the write driver 32 and the sense amplifier circuit 14a to read the data stored in a memory cell MC between each pair of bit lines BL and /BL Connections of the components during a write are the same as those during a read. For example, by a command for a write, one word line WL and one column are specified. The specified word line WL and column turn on some transistors in the same manner as in the read. In the state where the transistors specified by the command are on as shown in FIG. 19, the controller 27 controls one or more pairs of the write drivers 32 and 33 to pass the P or AP write current through a memory cell MC between each pair of the bit lines BL and /BL.

FIG. 20 illustrates connections of components during a logical operation in the memory device 3. Prior to a logical operation, the memory cells MC which belong to two columns in one column set and share one word line WL store two input data items for the logical operation, respectively. The two columns are the column of the bit line pair BL1 and /BL1, and the column of the bit line pair BL2 and /BL2, for example. The one remaining bit line pair includes the bit line BL3 and /BL3.

For execution of the logical operation, the controller 27 activates the word line WL coupled to the memory cells MC storing the data to which the logical operation is performed. This activation of the word line WL electrically couples the MTJ elements 31 in the memory cells MC coupled to the activated selected word line WL to corresponding bit line pairs BL and /BL. In each column set the MTJ elements 31 of the memory cells MC coupled to the bit line BL1, BL2, BL3 and the selected word line WL are referred to as the MTJ elements 311, 312, and 313 in the following description.

The controller 27 controls the column controller 23 to activate (or, make high) the column select lines CSLA1 and CSLA2 for the column associated with the input data. This activation turns on, in each column set, the transistors CSA1 and CSA2 to electrically couple the bit lines BL1 and BL2 to the output of the write driver 32.

Moreover, the controller 27 controls the column controller 23 to activate (or, make high) the control lines CLA1, CLA2, and CLA3. This activation turns on the transistor SS1, SS2, and SS3. As a result, in each column set, the bit lines/BL1, /BL2, and /BL3 are electrically coupled to each other.

Furthermore, the controller 27 controls the column controller 23 to turn on a transistor WS (for example, WS3) between the remaining bit line BL (for example, BL3) of one column of one column set and the write driver 35.

Such turning-on of the transistors forms two current paths in each column set. The first current path extends from the write driver 32 through the bit line BL1, the MTJ element 311, the bit line/BL1, the transistors SS1 and SS3, the bit line/BL3, the MTJ element 313, and bit line BL3 to the write driver 35. The second current path extends from the write driver 32 through the bit line BL2, the MTJ element 312, the bit line/BL2, the transistors SS2 and SS3, and the bit line/BL3, the MTJ element 313, and the bit line 3L3 to the write driver 35.

In the state where these current paths are formed, the controller 27 controls the write drivers 32 and 35 for the column set which includes the MTJ elements 311 and 312 storing the data to which the logical operation is performed (to be referred to as a selected column set hereinafter) to generate a voltage V3 or V4 between the write drivers 32 and 35. The voltage V3 is lower than the voltage V4. The voltage V3 or V4 is applied to the components between the write drivers 32 and 35. Which of the voltage V3 or V4 is applied is based on the type of logical operation to be performed. With this application of the voltage, currents flow through the two current paths from the write driver 32 to the write driver 35. The direction of this current is the same as the direction of the AP write current. The magnitude of the currents depend on the resistance states of the MTJ elements 311 and 312, and which of the voltage V3 and V4 is applied. The currents through the MTJ elements 311, 312, and 313 and the behavior of the MTJ elements 311, 312, and 313 based on the type of logical operation and application of voltage will be described with reference to FIGS. 21 and 22.

Figure 21:
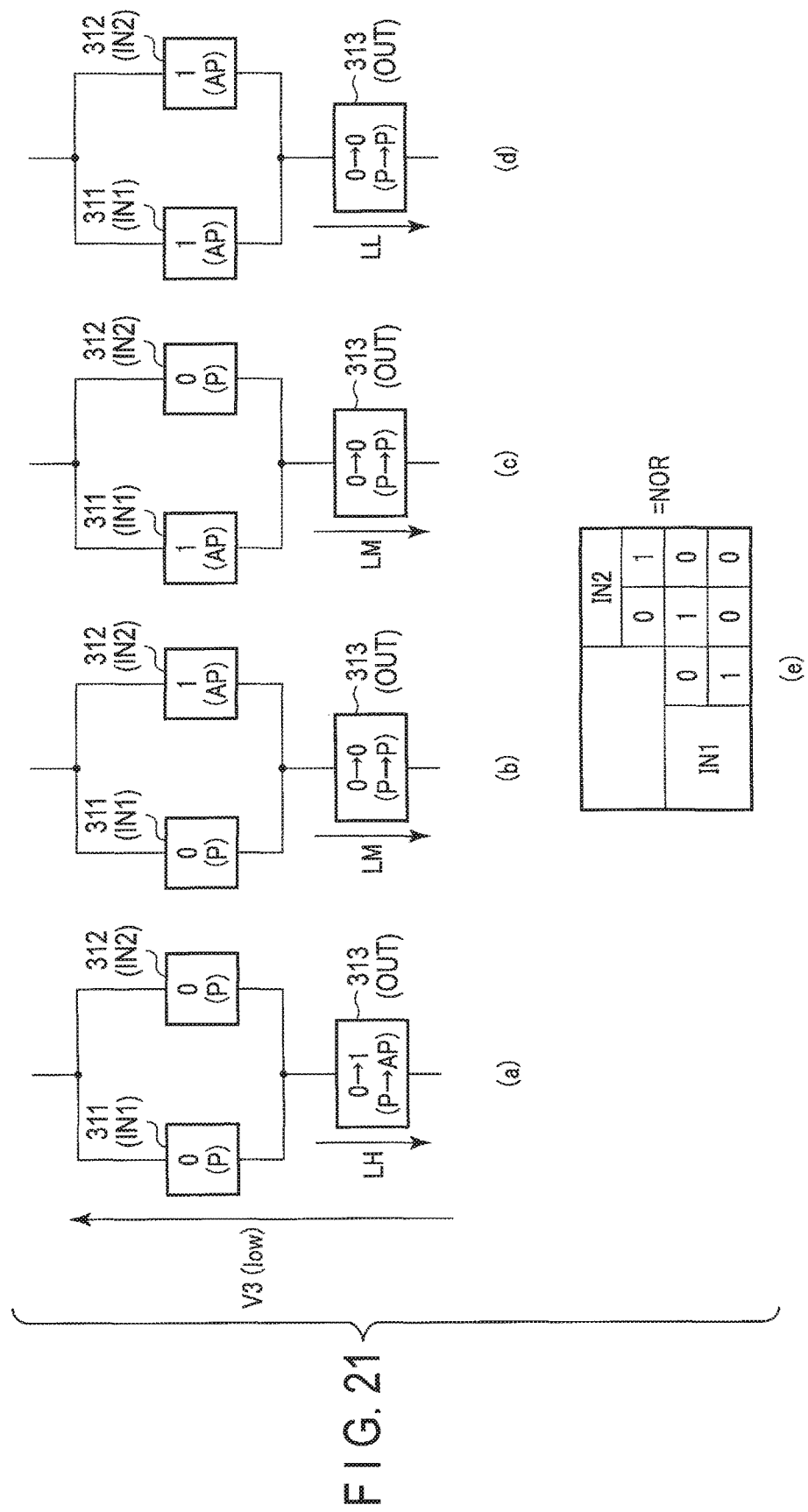
FIG. 21 illustrates an example of the state of associated MTJ elements during the logical operation in the memory device of the second embodiment.
Figure 22:
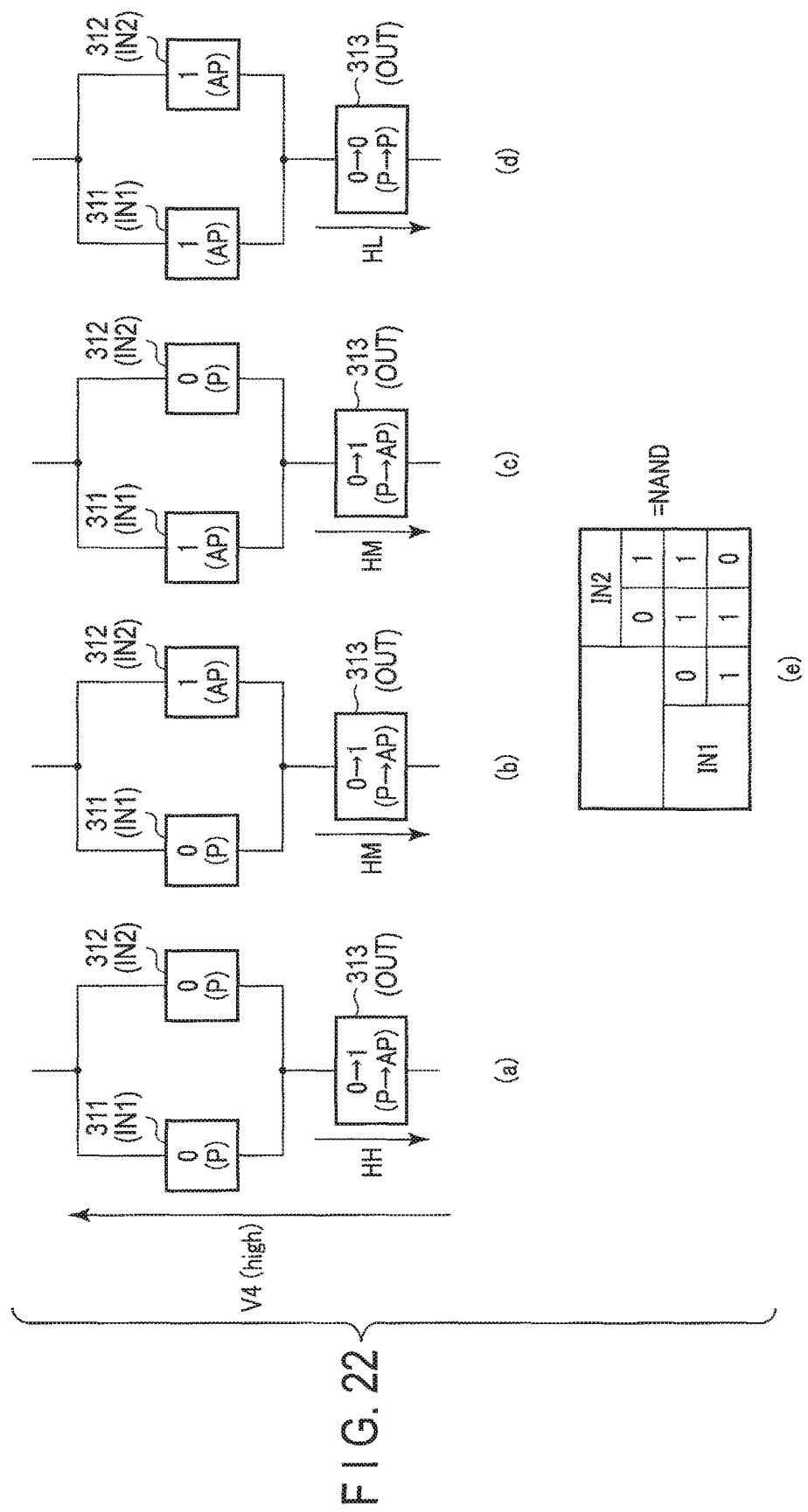
FIG. 22 illustrates another example of the state of associated MTJ elements during the logical operation in the memory device of the second embodiment.

FIGS. 21 and 22 illustrate examples of the states of the associated MTJ elements 311, 312, and 313 during the execution of the logical operation in the memory device 3. The figures illustrate the states where two current paths are already formed. Therefore, the MTJ elements 311 and 312 are coupled in parallel, and one end of the parallel-coupled MTJ elements 311 and 312 is coupled to the MTJ element 313. FIG. 21 illustrates the case of the voltage V3 applied, and FIG. 22 illustrates the case of the voltage V4 applied. FIGS. 21(*a*) and 22(*a*) illustrate states where both the MTJ elements 311 and 312 store "0" data (the P state). FIGS. 21(*b*) and 22(*b*) illustrate states where the MTJ elements 311 and 312 store "0" data and "1" data (P state and AP state), respectively. FIGS. 21(*c*) and 22(*c*) illustrate states where the MTJ elements 311 and 312 store "1" data and "0" data. FIGS. 21(*d*) and 22(*d*) illustrate states where both the MTJ elements 311 and 312 store "1" data. The MTJ element. 313 has been initialized to be in the P state prior to the start of logical operation.

In the FIG. 21(*a*) case, both the MTJ elements 311 and 312 have the lower resistance, and, therefore, the combined resistance of the MTJ elements 311 and 312 is smallest among the combined resistances in the states of (a) to (d). Moreover, the voltage V3 is applied to the both ends of the set of the components of FIG. 21(*a*). With such an applied voltage and combined resistance, a current flows through the MTJ element 313 from the reference layer 316 to the storage layer 315. This current has a magnitude of a value LH. The current of the value LH is larger than the magnitude of the AP write current, and, therefore, transfers the MTJ element 313 to the AP state. The voltage V3 and the resistance of the MTJ element 31 in the P state have magnitudes to allow for such a value LH. Specifically, the magnitude of the voltage V3 is set and/or the MTJ element 31 is configured (it has a material, and a thickness, etc.).

In contrast, in the FIG. 21 (*d*) case, the combined resistance of the MTJ elements 311 and 312 is largest among the combined resistances in the states of (a) to (d). The application of the voltage V3 passes a current through the MTJ element. 313 from the reference layer 316 to the storage layer 315, and the magnitude of this current has a value LL. The value LL is smaller than the magnitude of the AP write current. Therefore, even if the current of the value LL flows, the MTJ element 313 stays in the P state. The magnitude of the voltage V3 is set and/or the MTJ element 31 is configured to allow the value LL to be lower than the magnitude of the AP write current.

Similarly, in the FIGS. 21(b) and (c) cases, the combined resistance of the MTJ elements 311 and 312 has a magnitude between the magnitude of the combined resistance in the state (a) and the magnitude of the combined resistance in the state (d). The application of the voltage V3 passes a current through the MTJ element 313 from the reference layer 316 to the storage layer 317, and the magnitude of this current has a value LM. The value LM is smaller than the magnitude of the AP write current. Therefore, even if the current of the value LM flows, the MTJ element 313 remains in the P state. The magnitude of the voltage V3 is set and/or the MTJ element 31 is configured to allow the value LM to be lower than the magnitude of the AP write current.

The combinations of the logic of the inputs (or, states of the MTJ elements 311 and 312) and the states of the MTJ element 313 after the current flows produces a table of FIG. 21(e). The table of FIG. 21(e) is the same as the truth table of the NOR operation. Therefore, the result of the NOR operation to the data stored in the MTJ elements 311 and 312 can be stored in the MTJ element 313. When an external device coupled to the memory device 3 (for example, a memory controller or a host device) needs the result of the NOR operation, i.e., the data in the MTJ element 313, the external device uses a read command to read the data from the MTJ element 313. Responding to the read command, the controller 27 controls the sense amplifier circuit 14a for the selected column Set to read data from the MTJ element 313 to the external device.

The operation of the FIG. 22 is similar. The application of the voltage V4 passes a current of a value HH through the MTJ element 313 in the same direction as the AP write current in the state of FIG. 22(a), and a current of a value HM through the MTJ element 313 in the same direction as the AP write current in the states of FIGS. 22(b) and 22(c). The value HH is larger than the value HM, and both the values HH and HM are larger than the magnitude of the AP write current. Therefore, in the FIGS. 22(a), (b), and (c) cases, the flow of the currents transfer the MTJ element 313 to the AP state. In contrast, in the FIG. 22(d) case, a current of a value HL flows through the MTJ element 313 in the same direction as the AP write current. The value HL is smaller than the magnitude of the AP write current. Therefore, in the FIG. 22(d) case, the flow of the current does not transfer the MTJ element 313 to the AP state.

The magnitude of the voltage V4 is set and/or the MTJ element 31 is configured to allow the values NH and HM to be larger than the magnitude of the AP write current and the value HL to be smaller than the magnitude of the AP write current. The data read from the MTJ element 313 is the result of the logical operation according to the inputs.

The combinations of the logic of the inputs (or, states of the MTJ elements 311 and 312) and the states of the MTJ element 313 after the current flows produce a table of FIG. 22(e), The table of FIG. 22(e) is the same as the truth table of the NAND operation.

(Advantages)

According to the second embodiment, the memory device 3 includes not only the current paths for the ordinary data reads and writes, but the transistors SS1 to SS3 which couple three bit lines/BL with each other and the write driver (current sink) 5 selectively coupled to the bit line BL1, BL2, or BL3. This can form a current path from the write driver 32 through the MTJ elements 311 and 313 to the write driver 35, and a current path from the write driver 32 through the MTJ elements 312 and 313 to the write driver 35. The application of the low voltage V3 between the write drivers 32 and 35 can write in the MTJ element 313 the result of the NOR operation with the data stored in the MTJ elements 31 and 312 as the inputs. Moreover, the application of the high voltage V4 between the write drivers 32 and 35 can write in the MTJ element 313 the result of the NAND operation with the data stored in the MTJ elements 311 and 312 as the inputs. In this way, a logical operation circuit can be implemented with a part of the existing structure, while data reads and writes of the existing MRAM are possible.

In general, in order to perform logical operations to data in the MRAMs, such as the memory device 3, the data needs to be transmitted to a device with functionalities of logical operations outside of the memory device 3, which requires the data to be read. The reads of data need operation of the sense amplifier circuit 14a, which requires a certain amount of time to complete the sense. In contrast, according to the memory device 3, the sense amplifier circuit 14a is not involved in processes up to storing of the result of the logical operations. This enables the memory device 3 to complete the logical operations more quickly than in the case of the logical operations performed outside of the MRAMs. This is advantageous when, for example, the logical operations of the data already stored in the memory device 3 are required.

The description so far is based on the example where the second embodiment is based on the structure (or, components and connections) and the functionalities of the MRAMs. The structure for performing the logical operations does not necessarily need to be added to the MRAMs. The memory device 3 may have functionalities of the logical operations without having functionalities as a memory as in the first embodiment. In this case, the controller 27 only needs to be able to control the operations for the logical operations, for example.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A logical operation circuit comprising:
   a magnetic tunnel junction (MTJ) element comprising a first magnetic layer, a second magnetic layer, and an intermediate layer between the first and second magnetic layers, wherein the MTJ element transitions to a first state from a second state by a first voltage being applied to the MTJ element, and the MTJ element transitions to the second state from the first state by the first voltage being applied to the MTJ element; and
   a driver which is coupled to the first magnetic layer without a magnetic layer interposed and coupled to the second magnetic layer, and outputs the first voltage.

2. The circuit of claim 1, wherein an orientation of magnetization of the first magnetic layer and an orientation of magnetization of the second magnetic layer are antiparallel in the first state.

3. The circuit of claim 1, wherein:
   an orientation of magnetization of the first magnetic layer flips by a third current which flows through the MTJ element in the second state from the second magnetic layer to the first magnetic layer, the driver passes a selected one of a fourth current and a fifth current through the MTJ element in the second state from the second magnetic layer to the first magnetic layer,
the fourth current is larger than 1.5 times the third current, and
the third current is larger than 1.5 times the fifth current.

4. The circuit of claim 3, wherein:
the driver applies to the MTJ element the first voltage with the second magnetic layer at a higher potential to pass a second current or the fourth current and applies to the MTJ element a second voltage with the second magnetic layer at a higher potential to pass the fifth current,
the second voltage is lower than the first voltage,
a sixth current flows through the MTJ element by application of the second voltage to the MTJ element in the first state,
the sixth current is larger than 1.5 times a first current which flows through the MTJ element in the first state from the second magnetic layer to the first magnetic layer, and
an orientation of magnetization of the second magnetic layer flips by the first current.

5. The circuit of claim 4, wherein:
the orientation of the magnetization of the first magnetic layer and the orientation of the magnetization of the second magnetic layer are antiparallel in the first state, and
the orientation of the magnetization of the first magnetic layer and the orientation of the magnetization of the second magnetic layer are parallel in the second state.

6. The circuit of claim 4, further comprising:
a controller which:
receives a digital signal,
applies the first voltage to the MTJ element based on a logic of the digital signal and determines in which of the first and second states the MTJ element is in after the application of the first voltage, and
applies the second voltage to the MTJ element based on the logic of the digital signal, and determines in which of the first and second states the MTJ element is in after the application of the second voltage.

7. The circuit of claim 1, wherein:
the driver passes a selected one of a second current and a third current through the MTJ element in the first state from the second magnetic layer to the first magnetic layer,
the third current is smaller than 1.5 times a first current which flows through the MTJ element in the first state from the second magnetic layer to the first magnetic layer, and
an orientation of magnetization of the second magnetic layer flips by the first current.

8. The circuit of claim 7, wherein:
an orientation of the magnetization of the first magnetic layer flips by a fourth current which flows through the MTJ element in the second state from the second magnetic layer to the first magnetic layer,
the driver:
applies the first voltage with the second magnetic layer at a higher potential to the MTJ element to pass the second current or a fifth current, and
applies a second voltage with the second magnetic layer at a higher potential to the MTJ element to pass the third current or a sixth current,
the second voltage is lower than the first voltage,
the fifth current is larger than 1.5 times the fourth current, and
the sixth current is larger than 1.5 times the fourth current.

9. The circuit of claim 8, wherein:
the orientation of the magnetization of the first magnetic layer and the orientation of the magnetization of the second magnetic layer are antiparallel in the first state, and
the orientation of the magnetization of the first magnetic layer and the orientation of the magnetization of the second magnetic layer are parallel in the second state.

10. The circuit of claim 9, further comprising:
a controller which:
receives a digital signal,
applies the first voltage to the MTJ element based on a logic of the digital signal and determines in which of the first and second states the MTJ element is in after the application of the first voltage, and
applies the second voltage to the MTJ element based on the logic of the digital signal, and determines in which of the first and second states the MTJ element is in after the application of the second voltage.

11. The device of claim 1, wherein:
an orientation of magnetization of the second magnetic layer flips by a first current which flows through the MTJ element in the first state from the second magnetic layer to the first magnetic layer,
the driver passes a second current through the MTJ element in the first state from the second magnetic layer to the first magnetic layer, and
a magnitude of the second current is larger than 1.5 times a magnitude of the first current.

12. A memory device comprising:
a first to sixth interconnects;
a first MTJ element coupled between the first and second interconnects through a transistor;
a second MTJ element coupled between the third and fourth interconnects through a transistor;
a third MTJ element coupled between the fifth and sixth interconnects through a transistor;
a current source coupled to the first, third, and fifth interconnects through respective transistors;
a current sink coupled to the first, third, and fifth interconnects through respective transistors;
a first transistor and a second transistor coupled in series between the second and fourth interconnects; and
a third transistor between a connection node of the first and second transistors and the sixth interconnect,
wherein:
the current source is configured to output a first voltage and a second voltage different from the first voltage,
a state of the third MTJ element flips when a current higher than a first value flows through the third MTJ element,
the first and second MTJ elements have a first state and a second state different from the first state,
the state of the third MTJ element flips when the first voltage is output while the first and second MTJ elements are in the first state,
the state of the third MTJ element flips when the second voltage is output while the first MTJ element is in the first state and the second MTJ element is in the second state,
when the first voltage is output while the first MTJ element is in the first state and the second MTJ element is in the second state, the third MTJ element maintains the state prior to the output of the first voltage until an end of the output of the first voltage, and when the first voltage is output while the first and second MTJ elements are in the second state, the third MTJ element maintains the state prior to the output of the first voltage until the end of the output of the first voltage.

13. The device of claim 12, further comprising:
a second current sink coupled to the second, fourth, and sixth interconnects through respective transistors.

14. The device of claim 12, wherein the first and second transistors are on while the current source and the current sink are operating.

15. The device of claim 14, wherein the current sink is electrically coupled to the fifth interconnect while the current source is electrically coupled to the first and third interconnects.

* * * * *